US007244158B2

(12) United States Patent
Kimura et al.

(10) Patent No.: US 7,244,158 B2
(45) Date of Patent: Jul. 17, 2007

(54) METHOD OF MANUFACTURING COLOR FILTER SUBSTRATE, METHOD OF MANUFACTURING ELECTRO-OPTICAL DEVICE, ELECTRO-OPTICAL DEVICE, AND ELECTRONIC APPARATUS

(75) Inventors: Hideyuki Kimura, Suwa (JP); Shunichi Seki, Suwa (JP); Naoki Yamamoto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 212 days.

(21) Appl. No.: 11/108,781

(22) Filed: Apr. 19, 2005

(65) Prior Publication Data
US 2005/0266763 A1    Dec. 1, 2005

(30) Foreign Application Priority Data
May 27, 2004 (JP) .............................. 2004-157833
Sep. 30, 2004 (JP) .............................. 2004-288493

(51) Int. Cl.
*H01J 9/00* (2006.01)
(52) U.S. Cl. ......................................... 445/24; 445/25
(58) Field of Classification Search ............. 445/23–25
See application file for complete search history.

(56) References Cited
U.S. PATENT DOCUMENTS
3,445,666 A * 5/1969 Snaper .................... 250/214.1

FOREIGN PATENT DOCUMENTS

| JP | A 2002-252083 | 9/2002 |
|----|---------------|--------|
| JP | B2 3328297    | 9/2002 |
| JP | A 2003-249375 | 9/2003 |
| JP | A 2003-249376 | 9/2003 |
| JP | A 2003-249377 | 9/2003 |
| JP | A 2003-249378 | 9/2003 |
| JP | A 2004-087508 | 3/2004 |
| JP | A 2004-087509 | 3/2004 |

* cited by examiner

*Primary Examiner*—Joseph L Williams
(74) *Attorney, Agent, or Firm*—Oliff & Berridge, PLC

(57) ABSTRACT

To provide an electro-optical device, which is capable of improving film thickness uniformity and flatness of electro-optical layers to be formed. A method of manufacturing an electro-optical device according to the present invention comprises a step of forming a first partition wall portion and a second partition wall portion, and a step of ejecting a liquid substance for each of openings of each of the partition wall portions using a liquid droplet ejecting method, the liquid substance including functional materials composing the electro-optical layers. The ejected liquid substance has different viscosities for each electro-optical layer. In the partition wall portion formation step, a surface area of a portion of the first partition wall portion projecting from the second partition wall portion becomes relatively small in a position at which the liquid substance having relatively low viscosity is ejected, and the surface area of the portion of the first partition wall portion projecting from the second partition wall portion becomes relatively large in a position at which the liquid substance having relatively high viscosity is ejected.

5 Claims, 15 Drawing Sheets

FIG. 3

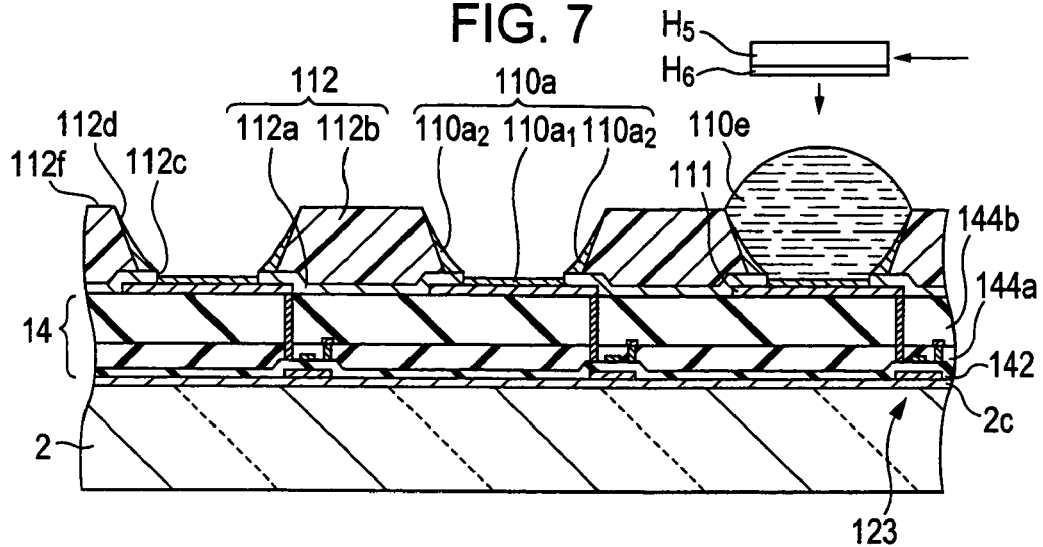
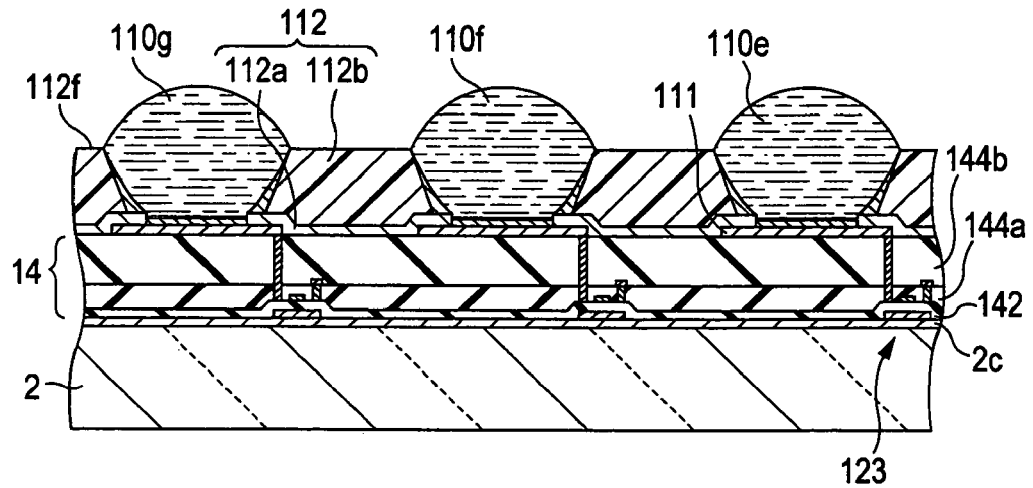
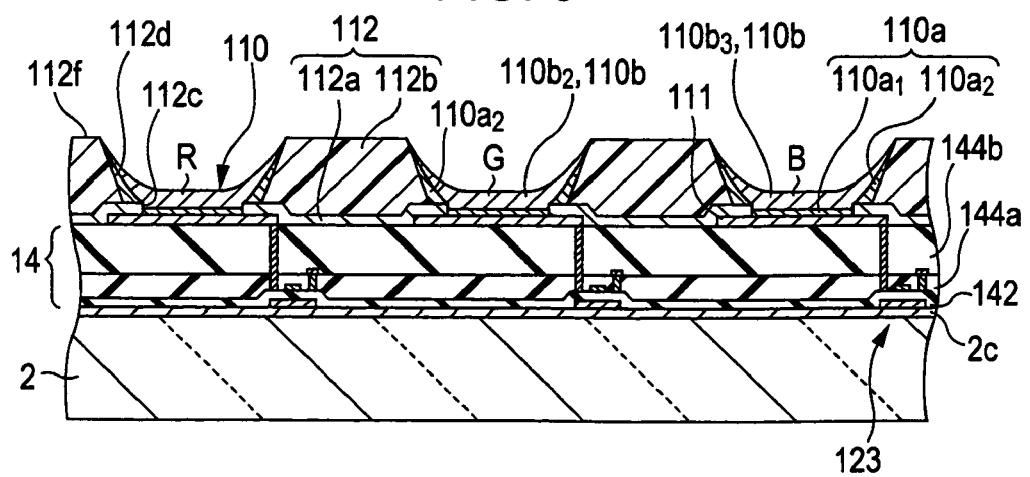

$\eta = 4$ $\eta = 9$ $\eta = 14$ $\eta = 19$ $\eta = 24$

L1=5

L1=4

L1=3

L1=2

L1=1

L1 = 5

L1 = 4

L1 = 3

L1 = 2

L1 = 1

L1=5

L1=4

L1=3

L1=2

L1=1

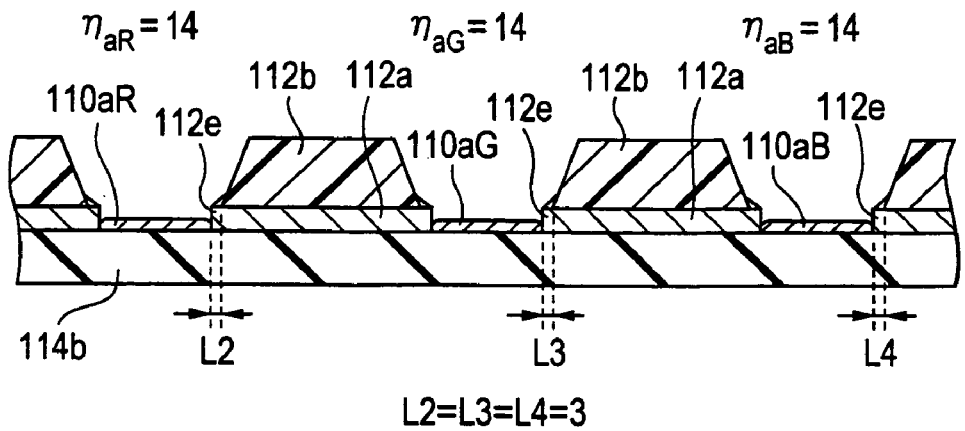
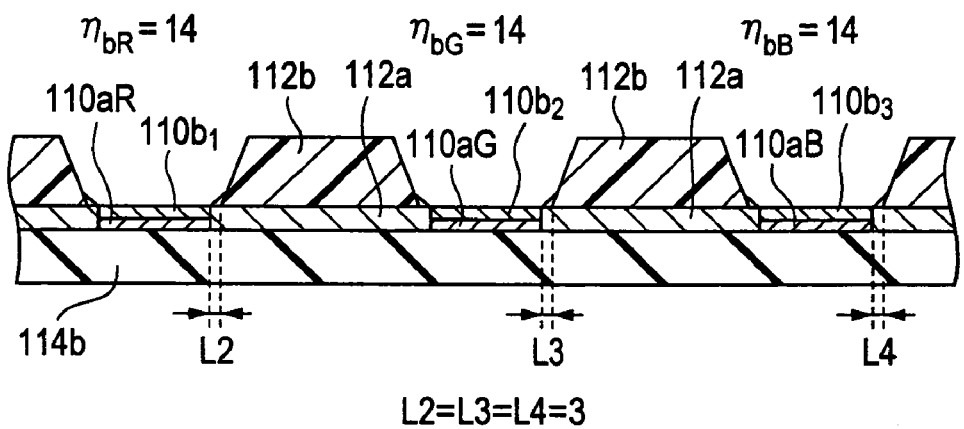
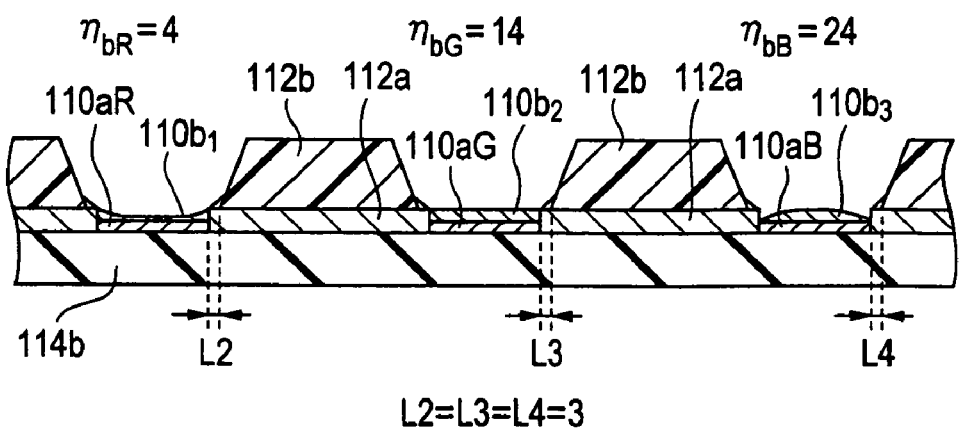

METHOD OF MANUFACTURING COLOR FILTER SUBSTRATE, METHOD OF MANUFACTURING ELECTRO-OPTICAL DEVICE, ELECTRO-OPTICAL DEVICE, AND ELECTRONIC APPARATUS

BACKGROUND

The present invention relates to a method of manufacturing a color filter substrate, a method of manufacturing an electro-optical device, an electro-optical device, and an electronic apparatus.

In recent years, there has been developed a color organic electroluminescent (EL) device having a structure where a light emitting layer formed of a light emitting material is inserted between an anode and cathode by adopting a method in which the light emitting material is patterned by an inkjet method of jetting ink made of a light emitting material, such as an organic fluorescent material, on a substrate (for example, Patent Document 1).

[Patent Document 1] Japanese Unexamined Patent Application Publication No. 2002-252083.

SUMMARY

However, in manufacturing the organic EL device using the inkjet method, it is important to make light emission characteristics (brightness, color purity, etc) of arranged pixels (light emitting elements) uniform, which has a significant effect on the product yield of the organic EL device. In order to make the light emission characteristics uniform, it is required to uniformly and flatly form light emitting layers among the pixels. Particularly, since the thickness uniformity and flatness of the layers are greatly varied depending on dry conditions of applied ink, the dry conditions become important factors for improving the uniformity of the light emitting elements. Although the above-mentioned Patent Document 1 has no definite description about a drying process of ink dropped on a substrate, the light emitting layers are actually formed by means of the following processes.

To begin with, a substrate on which pixel electrodes and banks for partitioning the pixel electrodes are formed is prepared, and hole injection/transport layers are formed in a region surrounded by the banks using the inkjet method. Next, on the substrate having the hole injection/transport layers formed thereon, ink for a red color light emitting layer, filled in an inkjet head, is dropped in the region surrounded by the banks, and thereafter, the dropped ink is dried to form the red color emitting layer. Similarly, ink for a green color light emitting layer is disposed on fixed points on the substrate using the inkjet head, to thereby form a green color light emitting layer through the drying process. Similarly, ink for a blue color light emitting layer is disposed on fixed points on the substrate using the inkjet head, to thereby form a blue color light emitting layer through the drying process. In this way, the color organic EL device is manufactured by disposing the red, green and blue color light emitting layers on the substrate in a predetermined pattern.

When the light emitting layers having the different light emitting colors are formed, a manufacturing method for dropping and drying one color ink, and then, forming light emitting layers having different colors is in common use. This is because the light emitting layers having the different colors have different ink solvent due to differences of ink components, and accordingly, optimal drop and dry conditions are different for each color.

However, it takes a long time to perform the drop and dry of ink for each color one by one. In addition, for example, in the course of a process the red color light emitting layer is formed and then the green color light emitting layer is formed, since the red color light emitting layer that has been already dried is exposed to a solvent atmosphere, it may be redissolved depending on a kind of solvent. As a result, there arises a problem in that the red color light emitting layer may be deteriorated, thus causing deterioration of characteristics of the red color light emitting layer.

Accordingly, the present invention is designed to solve the above-mentioned problem, and it is an object of the present invention to provide a manufacturing method of a color filter substrate having a plurality of coloring layers, which is capable of greatly improving a manufacture efficiency of the color filter substrate and improving film thickness uniformity and flatness of each coloring layer to be formed. It is another object of the present invention to provide a manufacturing method of an electro-optical device having a plurality of electro-optical layers such as a plurality of light emitting layers, which is capable of greatly improving a manufacture efficiency of the electro-optical device and improving film thickness uniformity and flatness of each electro-optical layer to be formed.

In order to achieve the above-mentioned objects, the present invention provides a method of manufacturing a color filter substrate including a plurality of coloring layers having a plurality of colors in a predetermined pattern, the method comprising a partition wall portion formation step of forming on a substrate a first partition wall portion having a first opening defining a region in which the coloring layers are formed and a second partition wall portion located on the first partition wall portion and having a second opening defining a region in which the coloring layers are formed; and an ejection step of ejecting liquid substances for the openings of the partition wall portions by using a liquid droplet ejecting method, the liquid substances being made by dissolving or dispersing coloring materials composing the respective coloring layers in solvents, wherein the ejected liquid substances have different viscosities for each coloring layer, and wherein, in the partition wall portion formation step, the first partition wall portion projects from an inner surface of the second opening of the second partition wall portion, a surface area of a portion of the first partition wall portion projecting from the second partition wall portion becomes relatively small in an opening through which the liquid substance having relatively low viscosity is ejected, and the surface area of the portion of the first partition wall portion projecting from the second partition wall portion becomes relatively large in an opening through which the liquid substance having relatively high viscosity is ejected.

The present inventors have repeated studies for overcoming the above-mentioned problem, and as a result, have discovered that the film thickness of the formed coloring layers becomes ununiform due to the viscosity of the liquid substance, that is, when the viscosity of the liquid substance is high, the film thickness of the coloring layer formed in the opening of the partition wall portion tends to become thick at a central portion of the coloring layer, on the other hand, when the viscosity of the liquid substance is low, the film thickness of the coloring layer formed in the opening of the partition wall portion tends to become thick at a peripheral portion (a side near the partition wall portion) of the coloring layer.

In addition, as a result of the studies, the present inventors have discovered that the film thickness of the formed coloring layer becomes ununiform due to the surface area of a portion (projecting portion) of the first partition wall portion projecting from an inner surface of the second opening of the second partition wall portion, that is, when the surface area of the projecting portion of the first partition wall portion is small, the film thickness of the coloring layer formed in the opening of the partition wall portion tends to become thick at a central portion of the coloring layer, on the other hand, when the surface area of the projecting portion of the first partition wall portion is large, the film thickness of the coloring layer formed in the opening of the partition wall portion tends to become thick at a peripheral portion (a side near the partition wall portion) of the coloring layer.

Base on the result of the studies, the present inventors have discovered a method of forming flat coloring layers having a uniform film thickness even when the viscosities of the liquid substance are different for each pattern of the coloring layers. The film thickness of the coloring layers can become uniform and the coloring layers can become flat by properly adjusting an area of the projecting portion of the first partition wall portion according to the viscosity of the liquid substance, as in the manufacturing method of the present invention, more specifically, by making a surface area of the projecting portion of the first partition wall portion relatively small in an opening through which the liquid substance having relatively low viscosity is ejected, and making the surface area of the projecting portion of the first partition wall portion relatively large in an opening through which the liquid substance having relatively high viscosity is ejected.

In order to achieve the above-mentioned objects, the present invention provides a method of manufacturing an electro-optical device including different types of electro-optical layers in a predetermined pattern, the method comprising a partition wall portion formation step of forming on a substrate a first partition wall portion having a first opening defining a region in which the electro-optical layers are formed and a second partition wall portion located on the first partition wall portion and having a second opening defining a region in which the electro-optical layers are formed; and an ejection step of ejecting liquid substances for the openings of the partition wall portions by using a liquid droplet ejecting method, the liquid substances being made by dissolving or dispersing functional materials composing the respective electro-optical layers in solvents, wherein the ejected liquid substances have different viscosities for each electro-optical layer, and wherein, in the partition wall portion formation step, the first partition wall portion projects from an inner surface of the second opening of the second partition wall portion, a surface area of a portion of the first partition wall portion projecting from the second partition wall portion becomes relatively small in an opening through which the liquid substance having relatively low viscosity is ejected, and the surface area of the portion of the first partition wall portion projecting from the second partition wall portion becomes relatively large in an opening through which the liquid substance having relatively high viscosity is ejected.

The present inventors have repeated studies for overcoming the above-mentioned problem, and as a result, have discovered that the film thickness of the formed electro-optical layers becomes ununiform due to the viscosity of the liquid substance, that is, when the viscosity of the liquid substance is high, the film thickness of the electro-optical layer formed in the opening of the partition wall portion tends to become thick at a central portion of the electro-optical layer, on the other hand, when the viscosity of the liquid substance is low, the film thickness of the electro-optical layer formed in the opening of the partition wall portion tends to become thick at a peripheral portion (a side near the partition wall portion) of the electro-optical layer.

In addition, as a result of the studies, the present inventors have discovered that the film thickness of the formed electro-optical layers becomes ununiform due to the surface area of a portion (projecting portion) of the first partition wall portion projecting from an inner surface of the second opening of the second partition wall portion, that is, when the surface area of the projecting portion of the first partition wall portion is small, the film thickness of the electro-optical layer formed in the opening of the partition wall portion tends to become thick at a central portion of the electro-optical layer, on the other hand, when the surface area of the projecting portion of the first partition wall portion is large, the film thickness of the electro-optical layer formed in the opening of the partition wall portion tends to become thick at a peripheral portion (a side near the partition wall portion) of the electro-optical layer.

Base on the result of the studies, the present inventors have discovered a method of forming flat electro-optical layers having a uniform film thickness even when the viscosities of the liquid substances are different for each pattern of the electro-optical layers. The film thickness of the electro-optical layers can become uniform and the electro-optical layers can become flat by properly adjusting the area of the projecting portion of the first partition wall portion according to the viscosity of the liquid substances, as in the manufacturing method of the present invention, more specifically, by making a surface area of the projecting portion of the first partition wall portion relatively small in an opening through which the liquid substance having relatively low viscosity is ejected, and making the surface area of the projecting portion of the first partition wall portion relatively large in an opening through which the liquid substance having relatively high viscosity is ejected.

In the partition wall portion formation step, the projecting length of the first partition wall portion projecting from the inner surface of the second opening of the second partition wall portion can become relatively short in an opening through which the liquid substance having relatively low viscosity is ejected, and the projecting length of the first partition wall portion projecting from the second partition wall portion can become relatively long in an opening through which the liquid substance having relatively high viscosity is ejected. With this configuration, the surface area of the projecting portion can be easily adjusted.

The method of manufacturing an electro-optical device according to the present invention further comprises, after the ejection step, a drying step of drying the ejected liquid substances simultaneously for electro-optical layers. In this way, by drying the electro-optical layers collectively, the product efficiency of the electro-optical devices can be greatly enhanced over the conventional product efficiency of the electro-optical devices. In addition, it is preferable to use the same solvent for the electro-optical layers when the electro-optical layers are simultaneously dried. However, if the same solvent is used for different functional materials, the viscosities of the liquid substances are varied. Accordingly, in this case, by using the manufacturing method of the present invention, it is possible to prevent or suppress problems of deviation of the film thickness of the electro-optical layers due to the difference between viscosities of the liquid substances.

Preferably, the drying step is a vacuum drying step by employing a vacuum dry in order to dry the liquid substance coated on the substrate, it is possible to control dry conditions minutely. Accordingly, after the drying step, the electro-optical layers having a uniform film thickness and a good flatness can be obtained.

In addition, the present invention provides an electro-optical device manufactured by the manufacturing method of the present invention. Furthermore, an electronic apparatus according to the present invention comprises the electro-optical device as, for example, a display unit. Accordingly, electro-optical devices and electronic apparatuses can be manufactured at low costs and with high reliability.

BRIEF DESCRIPTION OF THE DRAWINGS

FIG. 3 is a sectional view of a configuration of a display region in the organic EL device according to the embodiment of the present invention;

FIG. 7 is a process diagram illustrating the manufacturing method according to the embodiment of the present invention;

FIG. 8 is a process diagram illustrating the manufacturing method according to the embodiment of the present invention;

FIG. 9 is a process diagram illustrating the manufacturing method according to the embodiment of the present invention;

FIGS. 22A and 22B are sectional views illustrating a relationship between a shape of a layer to be formed, viscosity of a liquid composition, and a projecting width of a bank;

FIG. 23 is a sectional view illustrating a relationship between a shape of a layer to be formed, viscosity of a liquid composition, and a projecting width of a bank.

DETAILED DESCRIPTION OF EMBODIMENTS

Hereinafter, as an embodiment of an electro-optical device of the present invention, an organic EL device and a manufacturing method of the organic EL device will be described.

Figure 1:
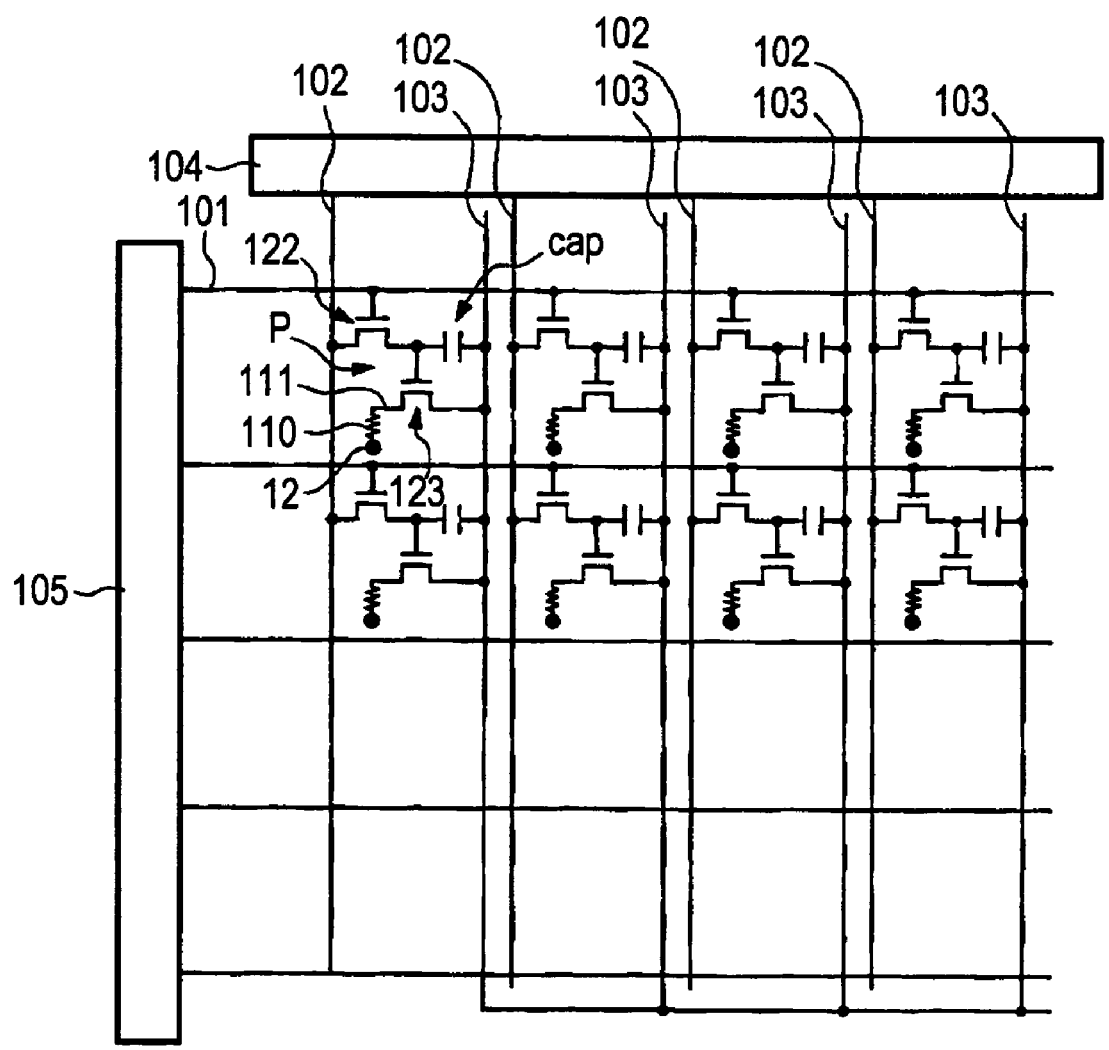
FIG. 1 is a circuit diagram of an organic EL device according to an embodiment of the present invention.
Figure 2:
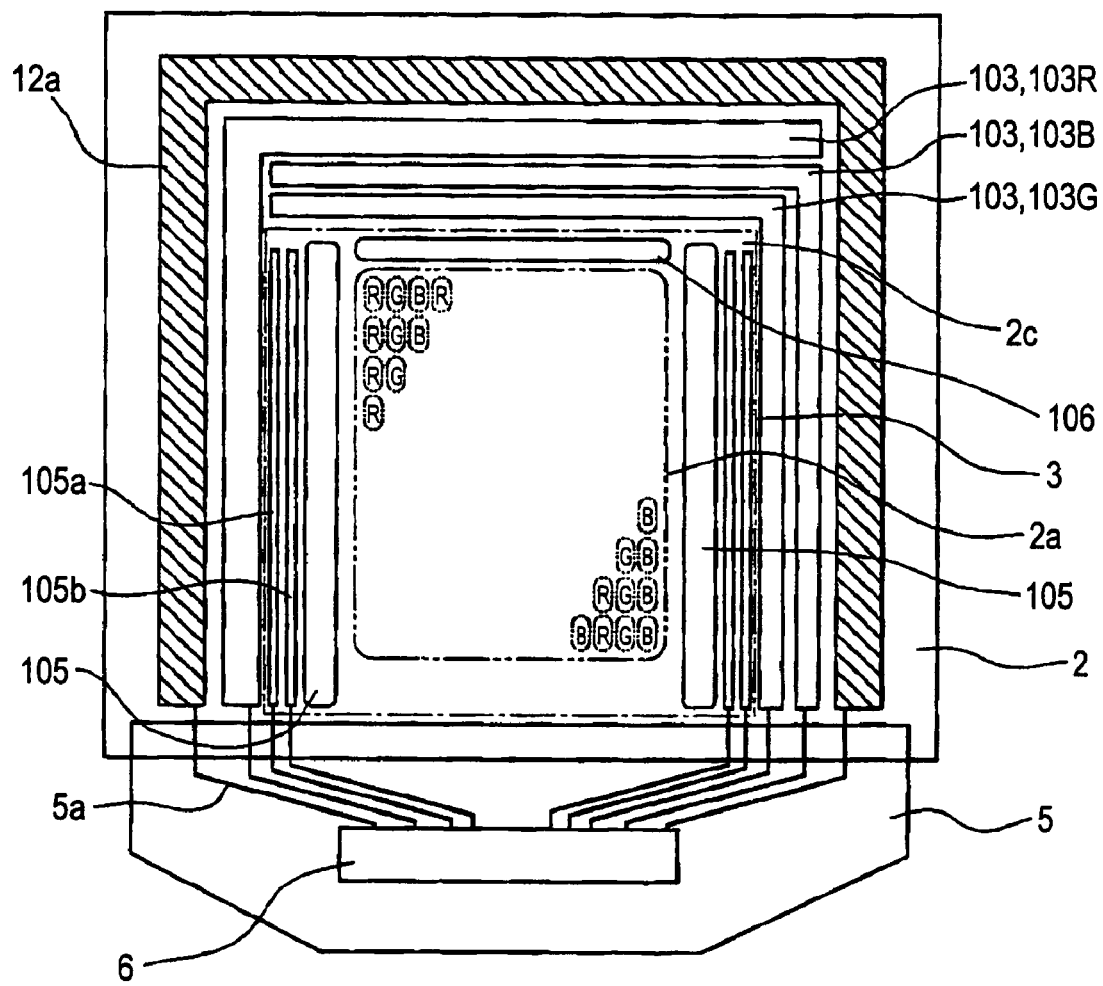
FIG. 2 is a plan view of a configuration of the organic EL device according to the embodiment of the present invention.
Figure 3:
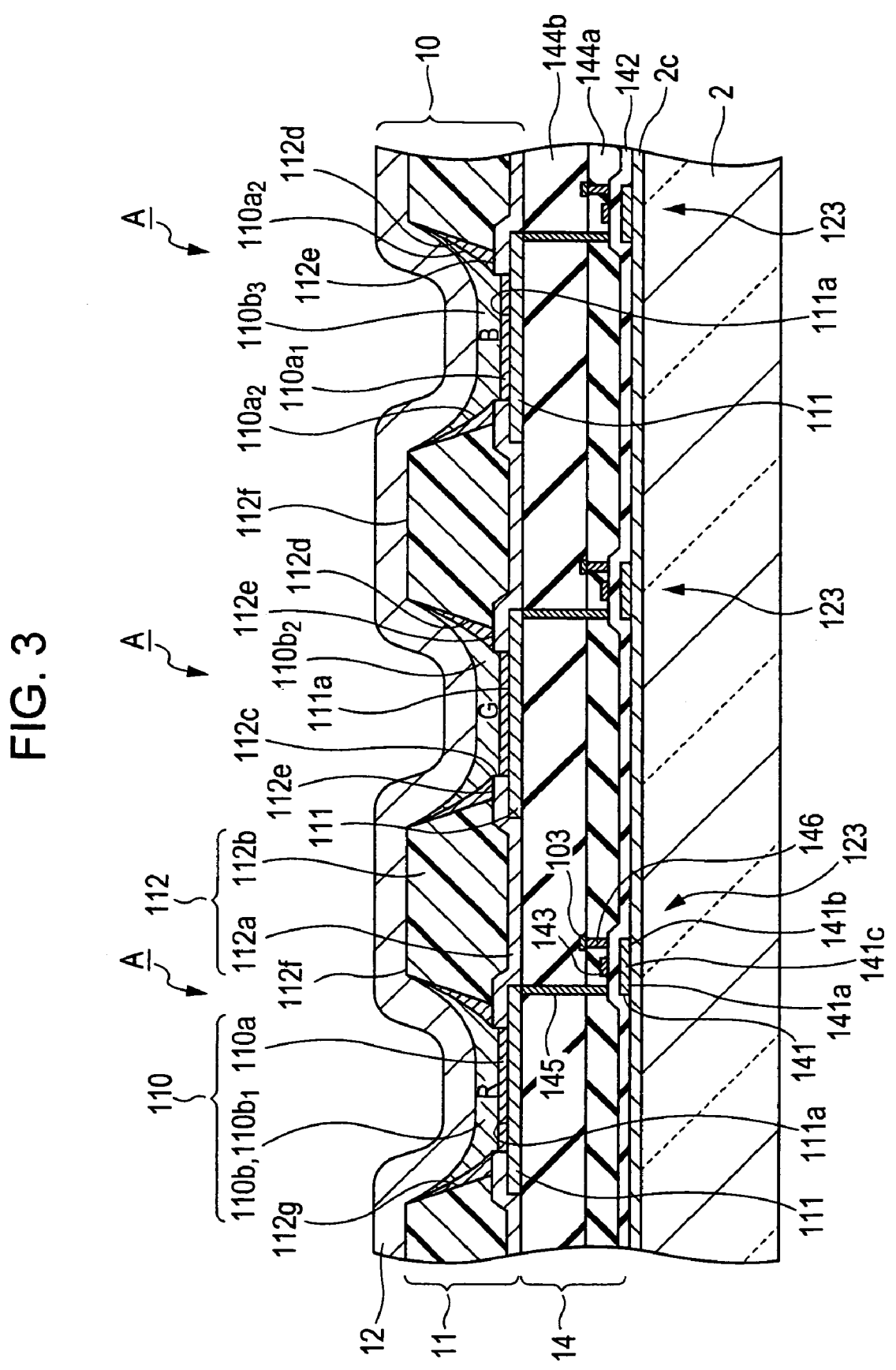

FIG. 1 is an explanatory diagram illustrating an interconnection structure of an organic EL device according to this embodiment, FIG. 2 is a schematic plan view of the organic EL device according to this embodiment, and FIG. 3 is a schematic sectional view of a display region of the organic EL device according to this embodiment.

(Organic EL Device)

As shown in FIG. 1, an organic EL device according to this embodiment includes a plurality of scan lines 101, a plurality of data lines 102 extending cross the plurality of scan lines 101, a plurality of power lines extending in parallel to the plurality of data lines 102, and pixel regions P provided in the vicinity of intersections of the plurality of scan lines 101 and the plurality of data lines 102.

A data line driving circuit 104 having a shift register, a level shifter, a video line, and an analog switch is connected to the data lines 102. In addition, a scan line driving circuit 105 having a shift register and a level shifter is connected to the scan lines 101.

In addition, each of the pixel circuits P includes a switching thin film transistor 122 having a gate electrode to which a scan signal is applied via a scan line 101, a storage capacitor cap for storing a pixel signal supplied from the data line 102 via the switching thin film transistor 122, a driving thin film transistor 123 of which a gate electrode receives the pixel signal stored in the storage capacitor cap, a pixel electrode (electrode) 111 into which a driving current flows from a corresponding power line 103 when the pixel electrode 111 is electrically connected to the power line 103 via the driving thin film transistor 123, and an organic EL layer 110 inserted between the pixel electrode 111 and a negative electrode (opposite electrode) 12. The pixel electrode 111, the opposite electrode 12 and the organic EL layer 110 compose a light emitting element.

When the scan line 101 is driven and the switching thin film transistor 122 is turned on, a potential of the data line 102 is maintained by the storage capacitor cap and the driving thin film transistor 123 is turned on or off depending on the state of the storage capacitor cap. In addition, a current flows from the power line 103 into the pixel electrode 111 via a channel of the driving thin film transistor 123 and a current flows into the negative electrode 12 via the organic EL layer 110. The organic EL layer 110 emits light in proportion to the amount of the current flowing into the organic EL layer 110.

As shown in FIG. 3, the organic EL device according to this embodiment includes a transparent substrate 2 made of glass and the like, a light emitting element portion 11 having light emitting elements formed on the substrate 2 and arranged in the form of a matrix, and the negative electrode 12 formed on the light emitting element portion 11. Here, the light emitting element portion 11 and the negative electrode 12 compose a display element 10.

The substrate 2 is formed of a transparent substrate such as glass and the like, and is divided into a display region 2a located at the center of the substrate 2 and a non-display region 2c located at the circumference of the substrate 2 and surrounding the display region 2a, as shown in FIG. 2. The display region 2a is a region in which the light emitting elements arranged in the form of the matrix are formed.

In addition, the power lines 103 (103R, 103G, and 103B) are arranged in the non-display region 2c. The scan line driving circuits 105 and 105 are arranged in both sides of the display region 2a, respectively. In addition, at one side of each of the scan line driving circuits 105 and 105 are arranged a driving circuit control signal line 105a and a driving circuit power line 105b, both of which are connected to each line driving circuit 105 and 105. A check circuit 106 for checking quality or defects of a display device when it is in the course of manufacturing or in the market is arranged above the display region 2a.

Three pixel regions A are shown in the sectional view of FIG. 3. In the organic EL device according to this embodiment, a circuit element portion 14 having circuits such as thin film transistors (TFTs), the light emitting element portion 11 having the organic EL layer 110, and the negative electrode 12 are stacked in order on the substrate 2. Under this configuration, light emitted from the organic EL layer 110 to the substrate 2 is outputted to a lower side (observer side) of the substrate 2 through the circuit element portion 14 and the substrate 2, and simultaneously, light emitted from the organic EL layer 110 to the opposite side of the substrate 2 is reflected by the negative electrode 12 and then is outputted to the lower side (observer side) of the substrate 2 through the circuit element portion 14 and the substrate 2.

In addition, when the negative electrode 12 is formed of a transparent material, light emitted from the negative electrode side can be outputted to the lower side of the substrate 2. The transparent negative electrode material may include an indium tin oxide (ITO), Pt, Ir, Ni, or Pd.

A base protective layer 2c made of a silicon oxide is formed in the circuit element portion 14 on the substrate 2, and an island-shaped semiconductor layer 141 made of polycrystalline silicon is formed on the base protective layer 2c. A source region 141a and a drain region 141b are formed in the semiconductor layer 141 by heavily doping P ions into the semiconductor layer 141. A portion of the semiconductor layer 141 into which the P ions are not doped forms a channel region 141c.

In addition, a transparent gate insulating layer 142 covering the base protective layer 2c and the semiconductor layer 141 is formed, a gate electrode 143 (scan line 101) made of Al, Mo, Ta, Ti, or W is formed on the gate insulating layer 142, and a first transparent interlayer insulating layer 144a and a second transparent interlayer insulating layer 144b are formed on the gate electrode 143 and the gate insulating layer 142. The gate electrode 143 is disposed at a location corresponding to the channel region 141c of the semiconductor layer 141. In addition, contact holes 145 and 146 are connected to the source and drain regions 141a and 141b of the semiconductor layers 141 through the first and second interlayer insulating layers 144a and 144b, respectively.

In addition, the transparent pixel electrode 111 made of ITO and the like is formed with a predetermined pattern on the second interlayer insulating layer 144b, and the contact hole 145 is connected to the pixel electrode 111. The contact hole 146 is connected to the power line 103. In this way, the driving thin film transistor 123 connected to the pixel electrode 111 is formed in the circuit element portion 14.

The light emitting element portion 11 includes, as a main body, organic EL layers 110 stacked on each of the plurality of pixel electrodes 111 . . . , and bank portions 112 formed between pixel electrodes 111 and between organic EL layers 110 for partitioning the organic EL elements 110. The negative electrode 12 is formed on the organic EL layers 110. The pixel electrodes 111, the organic EL layers 110 and the negative electrode 12 compose the light emitting element. Here, each pixel electrode 111 is made of, for example, ITO, and has a substantially rectangular pattern in a plane. The bank portions 112 have shapes of partitioning the pixel electrodes 111.

As shown in FIG. 3, each of the bank portions 112 has a structure where an inorganic bank layer (first bank layer) 112a, which serves as a first partition wall portion, located at the substrate 2 side and an organic bank layer (second bank layer) 112b, which serves as a second partition wall portion, spaced apart from the substrate 2 are stacked. The inorganic bank layer 112a is formed of, for example, $TiO_2$ or $SiO_2$, and the organic bank layer 112b is formed of, for example, an acryl resin or a polyimide resin.

The inorganic and organic bank layers 112a and 112b are formed in such a manner that they are placed on the peripheral portions of the pixel electrodes 111. When viewed from a plane, the peripheral portions of the pixel electrodes 111 partially overlap with the inorganic bank layer 112a. Similarly, the organic bank layer 112b overlaps with portions of the pixel electrodes 111 when viewed from the plane. In addition, the inorganic bank layer 112a is formed to further project toward the centers of the pixel electrodes 111 beyond an edge of the organic bank layer 112b. In this way, as a first stack portion (projecting portion) 112e of the inorganic bank layer 112a is formed inside the pixel electrodes 111, lower openings 112c corresponding to formation locations of the pixel electrodes 111 are formed.

In addition, upper openings 112d are formed in the organic bank layer 112b. The upper openings 112d are provided corresponding to the formation locations of the pixel electrodes 111 and the lower openings 112c. The upper openings 112d are formed to be wider than the lower openings 112c and narrower than the pixel electrodes 111, as shown in FIG. 3. In addition, upper portions of the upper openings 112d may be formed at the about same positions as end portions of the pixel electrodes 111. In this case, as shown in FIG. 3, the upper openings 112d of the organic bank layer 112b have inclined sections. In this way, openings 112g through which the lower openings 112c communicate with the upper openings 112d are formed in the bank portion 112.

In addition, the bank portion 112 has lyophilic regions and lyophobic regions. The lyophilic regions include the first stack portion 112e of the inorganic bank layer 112a and an electrode surface 111a of each pixel electrode 111. Surfaces of these regions are processed by lyophilic substance using a plasma process using oxygen as a process gas. In addition, the lyophobic regions include a wall of each upper opening 112d and a top surface 112f of the organic bank layer 112. Surfaces of these regions are processed by fluorine (by lyophobic substance) using a plasma process using tetrafluoromethane or carbon tetrafluoride as a process gas.

The organic EL layer 110 includes a hole injection/transport layer 110a stacked on the pixel electrode 111 and a light emitting layer 110b formed on the hole injection/transport layer 110a.

The hole injection/transport layer 110a serves to inject holes into the light emitting layer 110b and transport holes into the hole injection/transport layer 110a. By forming the hole injection/transport layer 110a between the pixel electrode 111 and the light emitting layer 110b, characteristics such as light emission efficiency and lifetime of the light emission layer 110b can be improved. In addition, the light emission layer 110b emits light as holes injected from the hole injection/transport layer 110a and electrons injected from the negative electrode 12 are recombined in the light emitting layer 110b.

The hole injection/transport layer 110a includes a flat portion 110a1 located within the lower opening 112c and formed on the pixel electrode surface 111a, and a peripheral portion 110a2 located within the upper opening 112d and formed on the first stack portion 112e of the inorganic bank layer. In addition, the hole injection/transport layer 110a may be formed on the pixel electrode 111 and only between the inorganic bank layers 112a (at the lower openings 112c) depending on its structure (or may be formed only on the above mentioned flat portion).

In addition, the light emitting layer 110b is formed on the flat portion 110a1 and peripheral portion 110a2 of the hole injection/transport layer 110a and has a thickness of 50 nm to 80 nm on the flat portion 110a1. The light emitting layer 110b has three kinds of light emitting layers, i.e., a red color light emitting layer 110b1 emitting red color (R) light, a green color light emitting layer 110b2 emitting green color (G) light, and a blue color light emitting layer 110b3 emitting blue color (B) light, which are arranged in a stripe shape, as shown in FIG. 2.

Since the peripheral portion 110a2 is formed at a ununiform thickness on the first stack portion 112e of the inorganic bank layer, it is electrically isolated from the pixel electrode 111 by the first stack portion 112e, and accordingly, holes are not injected from the peripheral portion 110a2 into the light emitting layer 110b. Accordingly, a current from the pixel electrode 111 flows only into the flat portion 110a1, and accordingly, the holes can be uniformly transported from the flat portion 110a1 to the light emitting layer 110b. As a result, only a central portion of the light emitting layer 110b emits light and the amount of light emission in the light emitting layer 110b can be uniformly maintained.

In addition, since the inorganic bank layer 112a extends toward the center of the pixel electrode 111 more than the organic bank layer 112b, a shape of a junction portion between the pixel electrode 111 and the flat portion 110a1 is trimmed by the inorganic bank layer 112a. Accordingly, deviation of light emission strength between the light emitting layers 110b can be suppressed.

In addition, since the electrode surface 111a of the pixel electrode 111 and the first stack portion 112e of the inorganic bank layer have lyophilic property, the organic EL layer 110 is uniformly stuck fast to the pixel electrode 111 and the inorganic bank layer 112a. Accordingly, the organic EL layer 110 is not excessively thinned on the inorganic bank layer 112a, and accordingly, a short between the pixel electrode 111 and the negative electrode 12 can be prevented.

In addition, since the top surface 112f of the organic bank layer 112b and the wall surface of the upper opening 112d have lyophobic property, the organic EL layer 110 is not well stuck to the organic bank layer 112b, and accordingly, the organic EL layer 110 does not overflow the opening 112g.

In addition, as a formation material of the hole injection/transport layer, for example, a mixture of polythiophene derivatives, such as polyethylenedioxithiophene, and polystylenesulfonic acid, and so on can be used. In addition, as a formation material of the light emitting layer 110b, for example, (poly) paraphenylenevinylene derivatives, polyphenylene derivatives, polyfluorene derivatives, polyvinylcarbazole, polythiophene derivatives, perylene pigment, coumarin pigment, or rhodamine pigment can be used, and moreover, these high molecular material doped with rubrene, perylene, 9,10-diphenylanthracene, tetraphenylbutadiene, nile red, coumarin 6, or quinacridone can be used.

The negative electrode 12 is formed on the entire surface of the light emitting element portion 11 and serves to flow a current into the organic EL layer 110, with the pixel electrode 111 paired. The negative electrode 12 is formed of, for example, a calcium layer and an aluminum layer, which are stacked. In this case, the negative electrode provided at a side near the light emitting layer preferably has a layer having a low work function. Particularly, with this configuration, the layer having the low work function makes a direct contact with the light emitting layer 110b and serves to inject electrons in the light emitting layer 110b.

In addition, LiF may be formed between the light emitting layer 110b and the negative electrode 12 in order to increase the light emission efficiency. In addition, the red and green color light emitting layers 110b1 and 110b2 may use other material without being limited to lithium fluoride. Accordingly, in this case, a layer formed of the lithium fluoride is stacked on only the blue color (B) light emitting layer 110b3 and materials other than the lithium fluoride may be stacked on the red and green color light emitting layers 110b1 and 110b2. Alternatively, only a calcium layer may be stacked on the red and green light emitting layers 110b1 and 110b2 without stacking the lithium fluoride thereon.

In addition, the aluminum layer forming a part of the negative electrode 12 serves to reflect light emitted from the light emitting layer 110b on the substrate 2. Accordingly, preferably, an Ag layer or a stack layer of an Al layer and an Ag layer may be used, as well as the aluminum layer. In addition, an antioxidation protective layer formed of SiO, $SiO_2$, or SiN can be formed on the aluminum layer.

In an actual organic EL device, a sealing portion is provided on the light emitting element portion 11 shown in FIG. 3. The sealing portion can be formed by, for example, coating a seal resin in an annular shape around the substrate 2 and sealing the sealing resin using a sealing vessel. The sealing resin is made of a thermosetting resin or an ultraviolet curing resin. Particularly, it is preferably made of an epoxy resin, which is a kind of the thermosetting resin. The sealing portion serves to prevent oxidation of the negative electrode 12 or the light emitting layer formed within the light emitting element portion 11. In addition, a gettering agent for absorbing water or oxygen may be provided inside the sealing vessel in order to absorb water or oxygen penetrated into the sealing vessel.

(Method of Manufacturing the Organic EL Device)

Next, a method of manufacturing the organic EL device of the present invention will be described with reference to the drawings.

The manufacturing method according to this embodiment includes (1) a bank portion formation process, (2) a hole injection/transport layer formation process, (3) a light emitting layer formation process, (4) a negative electrode formation process, and (5) a sealing process. The manufacturing method described here is provided as one example, and therefore, if necessary, some of the above mentioned processes may be omitted or other processes maybe added. In addition, (2) the hole injection/transport layer formation process and (3) the light emitting layer formation process are performed using a liquid ejecting method (an inkjet method) employing a liquid droplet ejecting apparatus.

In addition, in (3) the light emitting layer formation process of the manufacturing method of this embodiment, liquid composition ejected on the substrate 2 is composed of light emitting layer formation liquid compositions for each color using common mixed solvent, and, after ejection of the liquid compositions for each color is completed, a drying process is collectively performed.

(1) Bank Portion Formation Process

In the bank portion formation process, the bank portion 112 is formed at a predetermined position on the substrate 2. The bank portion 112 has an inorganic bank layer 112a as a first bank layer and an organic bank layer 112b as a second bank layer.

(1)-1 Formation of Inorganic Bank Layer 112a

Figure 4:
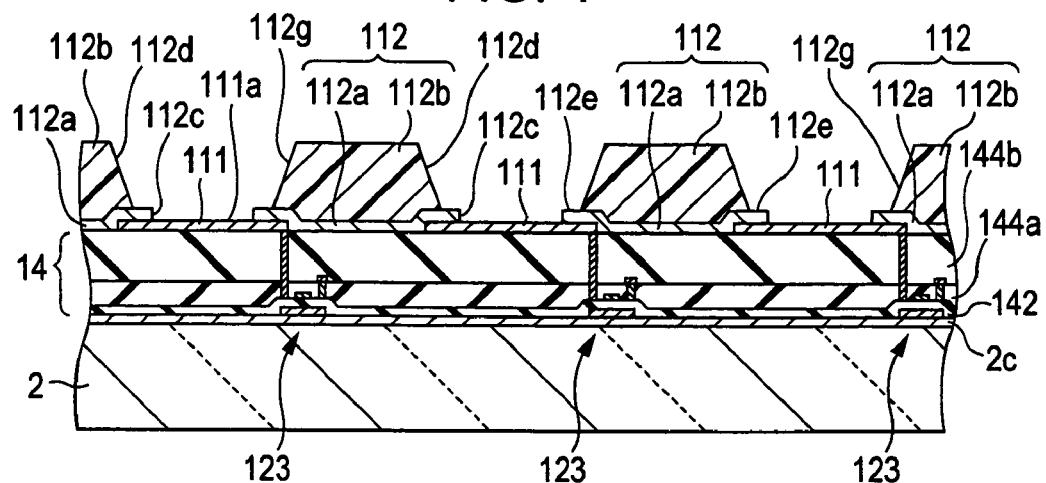
FIG. 4 is a process diagram illustrating a manufacturing method according to an embodiment of the present invention.

As shown in FIG. 4, first, the inorganic bank layer 112a is formed at the predetermined position on the substrate. The inorganic bank layer 112a is formed on the second interlayer insulating layer 144b and the pixel electrode 111. In addition, the second interlayer insulating layer 144b is formed on the circuit element portion 14 in which the thin film transistors, the scan lines and the data lines are arranged. The inorganic bank layer 112a is formed of, for example, an inorganic material such as $SiO_2$ or $TiO_2$. These materials are formed by, for example, a CVD method, a coating method, a sputtering method, a deposition method, etc. In addition, the film thickness of the inorganic bank layer 112a is preferably within a range of 50 nm to 200 nm, particularly, 150 nm.

The inorganic bank layer 112a is formed to have an opening by forming an inorganic film on the entire surfaces of the interlayer insulating layer 144 and the pixel electrode 111 and then patterning the inorganic film using a photolithography method and the like. This opening corresponds to a formation position of the electrode surface 111a of the pixel electrode 111 and is provided as the lower opening 112c, as shown in FIG. 4. In addition, the inorganic bank layer 112a is formed such that it partially overlaps with the peripheral portion of the pixel electrode 111. By this configuration, a planar light emitting region of the light emitting layer 110 is controlled.

(1)-2 Formation of Organic Bank Layer 112b

Next, the organic bank layer 112b is formed as the second bank layer.

More specifically, as shown in FIG. 4, the organic bank layer 112b is formed on the inorganic bank layer 112a. The organic bank layer 112b is made of a heat-resistant and solvent-resistant material such as an acryl resin or a polyimide resin. The organic bank layer 112b is formed by patterning this material using a photolithography method. In addition, when patterning, the upper opening 112d is formed in the organic bank layer 112b. The upper opening 112d is provided at a position corresponding to the electrode surface 111a and the lower opening 112c.

As shown in FIG. 4, the upper opening 112d is preferably formed to be wider than the lower opening 112c formed in the inorganic bank layer 112a. Moreover, the organic bank layer 112b preferably has a tapered section, and the lowermost of the organic bank layer 112b is preferably narrower than the width of the pixel electrode 111 and the uppermost of the organic bank layer 112b preferably has the about same width as the pixel electrode 111.

Accordingly, the first stack portion 112e surrounding the lower opening 112c of the inorganic bank layer 112a projects toward the center of the pixel electrode 111 more than the organic bank layer 112b. In this way, by communicating the upper opening 112d formed in the organic bank layer 112b with the lower opening 112c formed in the inorganic bank layer 112a, the opening 112g passing through the inorganic bank layer 112a and the organic bank layer 112b. In addition, in this embodiment, the amount of projection toward the center of the pixel electrode 111 with respect to the inorganic bank layer 112a is different for each pixel, more specifically, for each of the light emitting layers 110b1, 110b2 and 110b3.

In addition, the thickness of the organic bank layer 112b is preferably within a range of 0.1 μm to 3.5 μm, particularly, 2 μm. The reason for such a range is as follows.

In the case of the thickness of less than 0.1 μm, the thickness of the organic bank layer 112b is thinner than the total thickness of the hole injection/transport layer and the light emitting layer. This is not preferable since the light emitting layer 110b may overflow the upper opening 112d. In the case of the thickness of more than 3.5 μm, a step by the upper opening 112d becomes large. This is not preferable since a step coverage of the negative electrode 12 for the upper opening 112d can not be secured. In addition, when the thickness of the organic bank layer 112b is more than 2 μm, it is preferable since high isolation of the negative electrode 12 from the thin film transistor 123 can be achieved.

In addition, a proper surface process using a plasma process is preferably performed for the surfaces of the bank portion 112 and the pixel electrode 111. More specifically, a lyophobic process is performed for the surface of the bank portion 112 and a lyophilic process is performed for the surface of the pixel electrode 111.

To begin with, the surface process of the pixel electrode 111 may be performed by an $O_2$ plasma process using an oxygen gas. For example, a region including the surface of the pixel electrode 111 can be lyophilic by processing the surface of the pixel electrode 111 under conditions of plasma power of 100 kW to 800 kW, oxygen gas flow of 50 ml/min to 100 ml/min, substrate carrying speed of 0.5 mm/sec to 10 mm/sec, and substrate temperature of 70° C. to 90° C. In addition, simultaneously, cleaning of the surface of the pixel electrode 111 by the $O_2$ plasma process and adjustment of the work function are performed.

Next, the surface process of the bank portion 112 can be performed by a $CF_4$ plasma process using tetrafluoromethane. For example, the upper opening 112d and the top surface 112f of the bank portion 112 can be lyophobic by processing the upper opening 112d and the top surface 112f of the bank portion 112 under conditions of plasma power of 100 kW to 800 kW, tetrafluoromethane gas flow of 50 ml/min to 100 ml/min, substrate carrying speed of 0.5 mm/sec to 10 mm/sec, and substrate temperature of 70° C. to 90° C.

(2) Hole Injection/Transport Layer Formation Process

Next, in the light emitting element formation process, first, the hole injection/transport layer is formed on the pixel electrode 111.

In the hole injection/transport layer formation process, the liquid composition including a hole injection/transport layer formation material is ejected on the electrode surface 111a using, for example, an inkjet apparatus as the liquid droplet ejecting apparatus. Thereafter, by performing a drying process and a thermal process for the liquid composition, the hole injection/transport layer 110a is formed on the pixel electrode 111 and the inorganic bank layer 112a. In addition, the hole injection/transport layer 110a may not be formed on the first stack portion 112e, that is, may be formed on only the pixel electrode 111.

Figure 5:
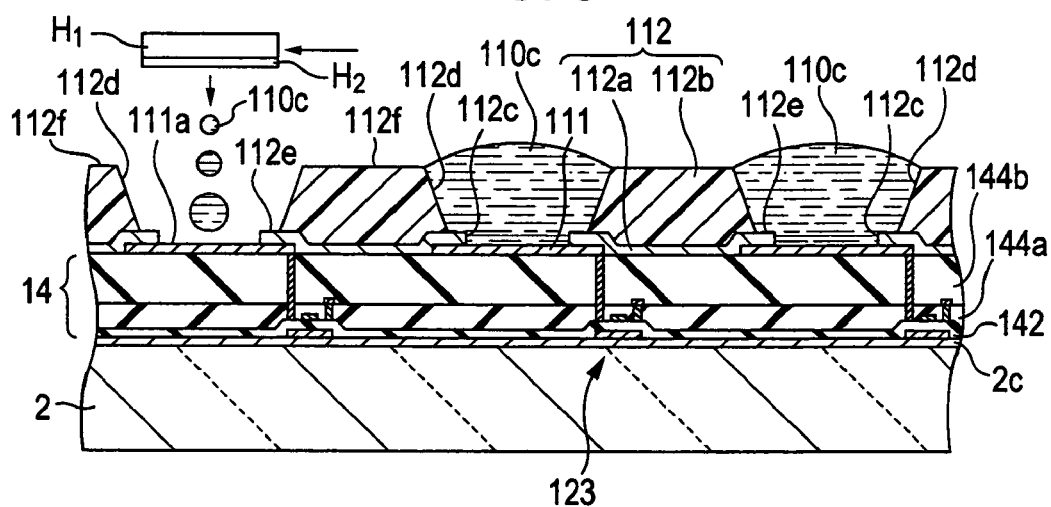
FIG. 5 is a process diagram illustrating the manufacturing method according to the embodiment of the present invention.

The manufacturing method using the inkjet method is as follow. As shown in FIG. 5, the liquid composition including the hole injection/transport layer formation material is ejected from a plurality of nozzles formed in an inkjet head H1. Although each pixel is filled with the liquid composition by scanning the inkjet head in this embodiment, it can be also achieved by scanning the substrate 2. In addition, each pixel can be filled with the liquid composition by moving the inkjet head and the substrate 2 in relation to each other. Such filling of the liquid composition is also true of processes performed using the inkjet head in the following description.

The ejection of the liquid composition using the inkjet head is as follows. The liquid composition is ejected from an ejecting nozzle H2 arranged, opposite to the electrode surface 111a, in the inkjet head H1. The bank 112 for partitioning the lower openings 112c is formed around the pixel electrode 111, and, while moving the inkjet head H1 in relation to the substrate 2, with the inkjet head H1 opposite to the pixel electrode surface 111a located within the lower opening 112c, droplets 110c of the liquid composition, with liquid measure per one drop controlled, are ejected on the electrode surface 111a from the ejecting nozzle H2.

The liquid composition used in this process includes, for example, a composition made by dissolving a mixture of polythiophene derivatives, such as polyethylenedioxithiophene (PEDOT), and polystylenesulfonic acid (PSS) and so on in a polar solvent. The polar solvent includes, for example, isopropyl alcohol (IPA), normal butanol, γ-butyrolactone, N-methyl pyrolidone (NMP), 1,3-dimethyl-2-imidazolidinone (DMI), derivatives thereof, glycol ethers such as carbitol acetate or butyl carbitol acetate.

As details of liquid composition, a composition of a PEDOT/PSS mixture (PEDOT/PSS=1:20): 12.52% in weight, IPA: 10% in weight, NMP: 27.48% in weight, DMI: 50% in weight may be exemplified. In addition, viscosity of the liquid composition is preferably within a range of 1 mPa·s to 20 mPa·s, particularly, 4 mPa·s to 15 mPa·s.

By using the above-mentioned liquid composition, the liquid composition can be ejected without the ejecting nozzle H2 blocked. In addition, the hole injection/transport layer formation material may include the same material for the red color (R), green color (G) and blue color (B) light emitting layers 110b to 110b3, or different material for each color light emitting layer. In this embodiment, different hole injection/transport layer formation materials are used for each red color (R), green color (G) and blue color (B) light emitting layer 110b1 to 110b3, and the viscosity of the ejected liquid composition is different for each color light emitting layer 110b1 to 110b3.

Figure 12:
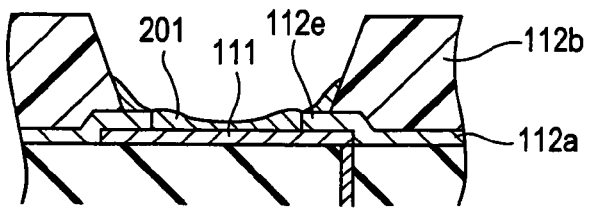
FIG. 12 is an explanatory diagram illustrating one aspect of a layer formed in a bank portion.
Figure 13:
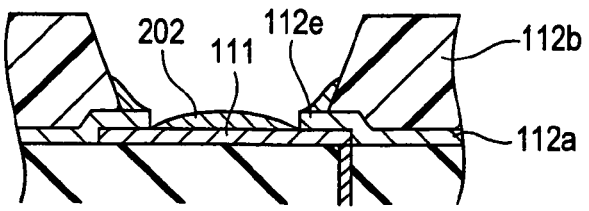
FIG. 13 is an explanatory diagram illustrating another aspect of a layer formed in a bank portion.

However, when liquid compositions having different viscosities are ejected, the film thickness of the hole injection/transport layer may become ununiform due to the viscosity difference. More specifically, if the viscosity of the liquid composition is low (for example, 1 mPa·s), the film thickness of a formed layer 201 tends to be large at a peripheral portion (here, a side near the inorganic bank portion 112a) of the layer 201, as shown in FIG. 12. On the other hand, if the viscosity of the liquid composition is high (for example, 20 mPa·s), the film thickness of a formed layer 202 tends to be large at a central portion of the layer 202, as shown in FIG. 13.

Figure 11:
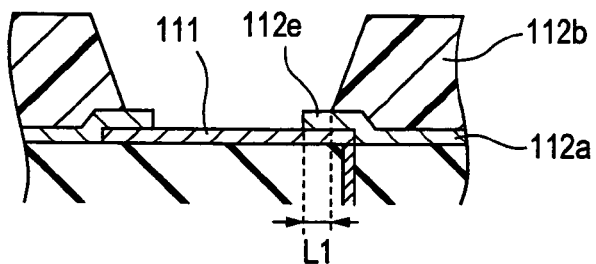
FIG. 11 is an enlarged schematic diagram of a stack structure of an inorganic bank layer and an organic bank layer.

On the other hand, apart from the viscosity, the film thickness of the formed hole injection/transport layer may become ununiform by the surface area of a portion (the first stack portion) 112e of the inorganic bank layer 112a projecting from the inner surface of the opening of the organic bank layer 112b. Specifically, if the surface area of the projecting portion 112e of the inorganic bank layer 112a is large, the film thickness of a formed layer tends to be large at a peripheral portion (a side near the partition portion) of the layer. On the other hand, if the surface area of the projecting portion 112e of the inorganic bank layer 112a is small, the film thickness of a formed layer tends to be large at a central portion of the layer. More specifically, when the projection width (width L1 shown in FIG. 11) of the projecting portion 112e of the inorganic bank layer 112a is an order of 5 μm, the film thickness of the formed layer tends to be large at the peripheral portion (the side near the partition portion) of the layer (see FIG. 12). On the other hand, when the projection width (the width L1 shown in FIG. 11) of the projecting portion 112e of the inorganic bank layer 112a is an order of 1 μm, the film thickness of the formed layer tends to be large at the central portion of the layer (see FIG. 13).

Accordingly, in this embodiment, since the viscosity of the liquid composition ejected for each color light emitting layer 110b1 to 110b3 is different, by making the surface area of the projecting portion 112e of the inorganic bank layer 112a different in advance for each light emitting layer 110b1 to 110b3 (i.e., for different color pixels), the hole injection/transport layer is prevented or suppressed from having ununiform film thickness. More specifically, for a pixel ejecting the liquid composition having relatively high viscosity, the amount of projection of the projecting portion 112e becomes large to increase the surface area of the projecting portion 112e. On the other hand, for a pixel ejecting the liquid composition having relatively low viscosity, the amount of projection of the projecting portion 112e becomes small to decrease the surface area of the projecting portion 112e.

Returning to FIG. 5, the liquid droplets 110c of the ejected liquid composition are spread over the lyophilic-processed electrode surface 111a and the first stack portion 112e and are filled in the lower and upper openings 112c and 112d. Even if a first liquid composition droplet 110c is deviated from a predetermined ejection position and is ejected on the top surface 112f, the first liquid composition droplet 110c rolls into the lower and upper openings 112c and 112d without the top surface 112f wet by the first liquid composition droplet 110c.

The amount of liquid composition ejected on the electrode surface 111a depends on the size of the lower and upper openings 112c and 112d, the thickness of the hole injection/transport layer to be formed, the concentration of the hole injection/transport layer formation material in the liquid composition, etc. In addition, the liquid droplets 110c of the liquid composition may be ejected on the electrode surface 111a not only one time but also multiple times. In this case, the amount of the liquid composition for each time may be equal or different. In addition, the liquid composition may be ejected on not only the same location of the electrode surface 111*a* but also different locations of the electrode surface 111*a* for each time.

Figure 14:
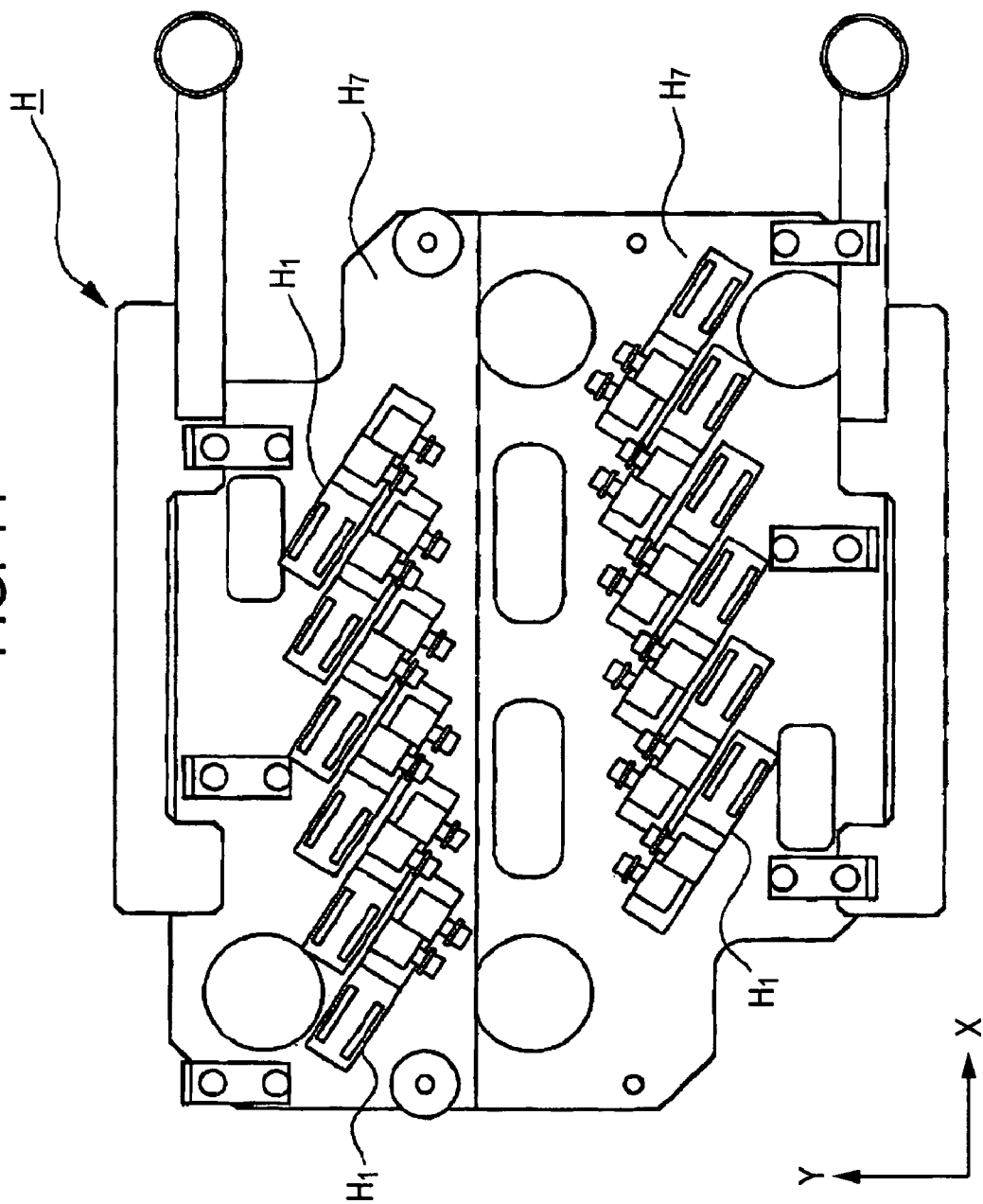
FIG. 14 is a plan view of a head according to an embodiment of the present invention.

In connection with a structure of the inkjet head, a head H shown in FIG. 14 may be used. In addition, the substrate and the inkjet head are preferably arranged as shown in FIG. 15.

In FIG. 14, reference numeral H7 denotes a support substrate for supporting a plurality of inkjet heads H1 mounted thereon.

On an ink ejection surface (a surface opposite to the substrate) of the inkjet head H1 are provided a plurality of ejecting nozzles (for example, 180 nozzles in one column, the total of 360 nozzles) in two columns in the form of a column along the longitudinal direction of the head, with an interval in the width direction of the head. In addition, while the ejecting nozzles direct toward the substrate, a plurality of inkjet heads H1 (6 in one column, the total of 12 in FIG. 14) are positioned and supported on a roughly rectangular supporting plate 20, when viewed from top, arranged in two columns in the form of a column approximately along an X axis direction at an inclined angle with respect to the X axis (or Y axis), with an interval in a Y axis direction.

Figure 15:
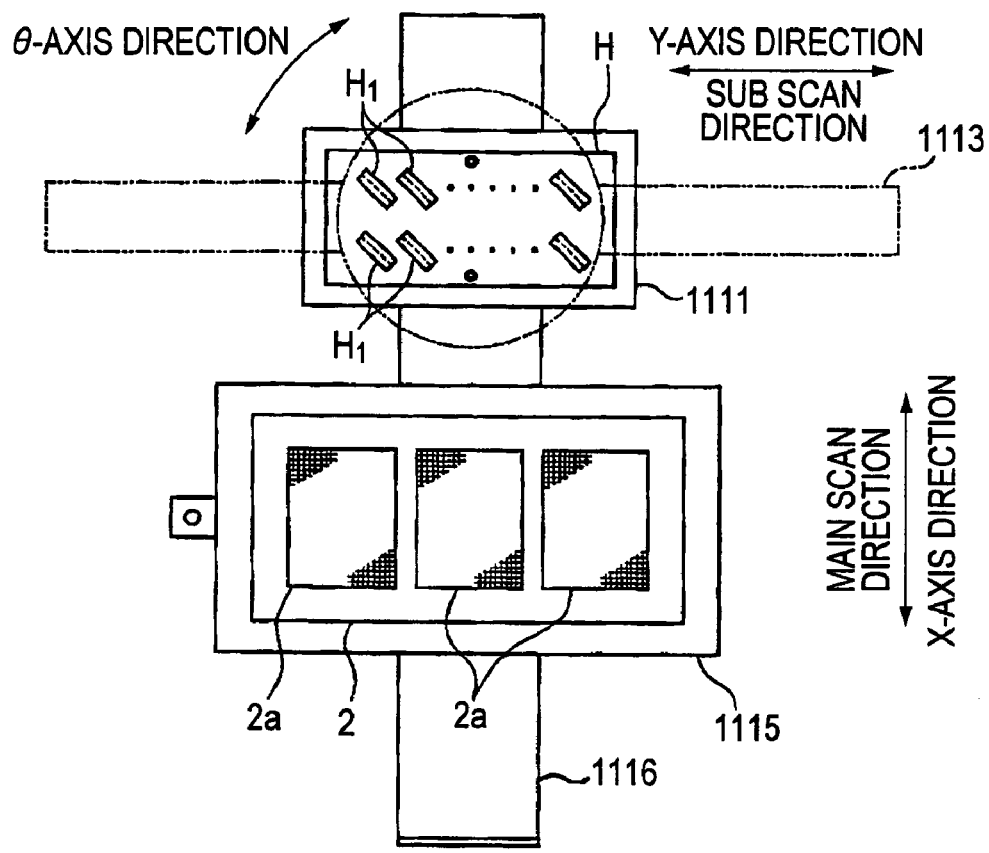
FIG. 15 is a plan view of an inkjet apparatus according to an embodiment of the present invention.

In the inkjet apparatus shown in FIG. 15, reference numeral 1115 denotes a stage for loading the substrate 2 and reference numeral 1116 denotes a guide rail for guiding the stage 1115 in the X axis direction (a main scan direction) in the figure. In addition, the head H is movable in the Y axis direction (a sub scan direction) in FIG. 15 by a guide rail 1113 via a supporting member 1111 and is rotatable in a θ axis direction in the figure to incline the inkjet head H1 at a predetermined angle with respect to the main scan direction. In this way, by arranging the inkjet head at an inclined angle with respect to the main scan direction, it is possible to correspond nozzle pitches to pixel pitches. In addition, by adjusting the inclined angle, the nozzle pitches can correspond to any pixel pitches.

The substrate 2 shown in FIG. 15 has a structure where a plurality of chips is arranged on a mother substrate. In this structure, one chip region corresponds to one display device. Here, three display regions 2*a* are formed, however, the present invention is not limited to this. For example, when a left display region 2*a* on the substrate 2 is to be coated with the liquid composition, the head H is moved to the left side in FIG. 15 via the guide rail 1113 and the substrate 2 is moved to the top side in FIG. 15 via the guide rail 1116. Then, the left display region 2*a* is coated with the liquid composition while scanning the substrate 2. Next, the head H is moved to the right side of the figure and then a middle display region 2*a* is coated with the liquid composition. This process is also true of a right display region 2*a*. In addition, the head H shown in FIG. 14 and the inkjet apparatus shown in FIG. 15 are used not only in the hole injection/transport layer formation process but also in the light emitting layer formation process.

Figure 6:
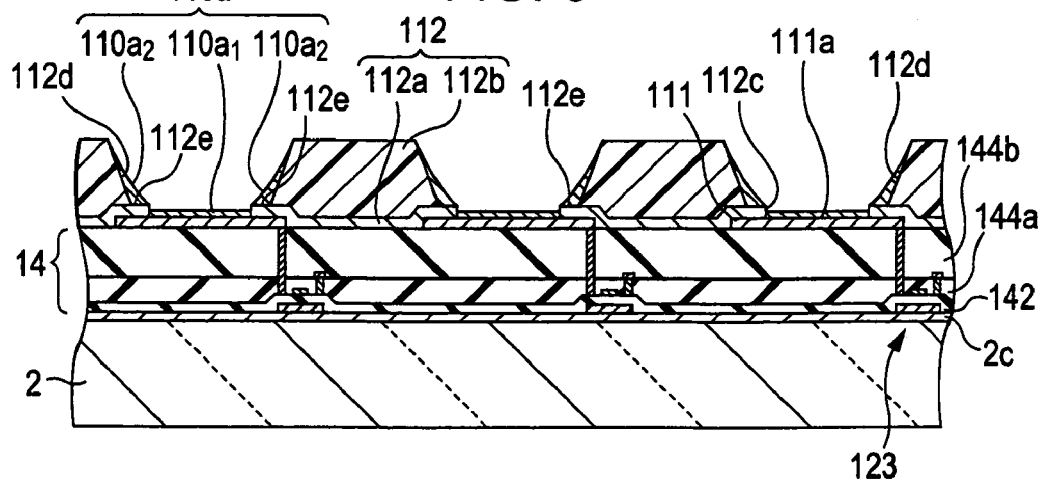
FIG. 6 is a process diagram illustrating the manufacturing method according to the embodiment of the present invention.

Next, the drying process as shown in FIG. 6 is performed. The first liquid composition after ejection is dried to evaporate the solvent included in the first liquid composition so as to form the hole injection/transport layer 110*a*. When the drying process is performed, the evaporation of the solvent included in the liquid composition mainly occurs at a location near the inorganic bank layer 112*a* and the organic bank layer 112*b*, and, at the same time of evaporating the solvent, the hole injection/transport layer formation material is concentrated and educed. Accordingly, as shown in FIG. 6, the peripheral portion 110*a*2 made of the hole injection/transport layer formation material is formed on the first stack portion 112*e*. The peripheral portion 110*a*2 is adhered closely to a wall surface (the organic bank layer 112*b*) of the upper opening 112*d* and has the thickness that is thin at a side near the electrode surface 111*a* and is thick at a side distant from the electrode surface 111*a*, i.e., a side near the organic bank layer 112*b*.

At the same time, the evaporation of the solvent also occurs on the electrode surface 111*a* by the drying process, and thus, the flat portion 110*a*1 made of the hole injection/transport layer formation material is formed on the electrode surface 111*a*. Since an evaporation speed of the solvent on the electrode surface 111*a* is nearly uniform, the hole injection/transport layer formation material is uniformly concentrated on the electrode surface 111*a*, and thus, the flat portion 110*a*1 having a uniform thickness is formed. In this way, the hole injection/transport layer 110*a* composed of the peripheral portion 110*a*2 and the flat portion 110*a*1 is formed. Alternatively, the hole injection/transport layer may not be formed on the peripheral portion 110*a*2, but may be formed on only the electrode surface 111*a*.

The above-described drying process is performed at a room temperature under a pressure of, for example, 133.3 Pa (1 Torr) in a nitrogen atmosphere. If the pressure is too low, it is not preferable since the liquid droplets 110*c* of the liquid composition are abruptly boiled. In addition if temperature is high above the room temperature, a flat film may not be formed since an evaporation speed of a polar solvent becomes high. After the drying process, it is preferable to remove the polar solvent or water remaining in the hole injection/transport layer 110*a* by performing a thermal process, preferably, at a temperature of 200° C. for ten minutes in a vacuum.

In the above-described hole injection/transport layer formation process, while the lower and upper openings 112*c* and 112*d* are filled with the ejected liquid droplets 110*c* of the liquid composition, the liquid composition bounces back from the lyophobic-processed organic bank layer 112*b* and rolls into the lower and upper openings 112*c* and 112*d*. Thus, the lower and upper openings 112*c* and 112*d* can be always filled with the ejected liquid droplets 110*c* of the liquid composition to form the hole injection/transport layer 110*a* on the electrode surface 111*a*.

(3) Light Emitting Layer Formation Process

The light emitting layer formation process includes a light emitting layer formation material ejecting process and a drying process.

Like the above-described hole injection/transport layer formation process, the liquid composition for formation of the light emitting layer is ejected on the hole injection/transport layer 110*a* using the inkjet method. Thereafter, the ejected liquid composition is dried (and heated) to form the light emitting layer 110*b* on the hole injection/transport layer 110*a*.

FIG. 7 shows an ejecting process of the liquid composition including the light emitting layer formation material using the inkjet method. As shown in the figure, the inkjet head H5 is moved in relation to the substrate 2, and the liquid composition containing the each color (here, for example, blue color (B)) light emitting layer formation material is ejected from the ejecting nozzles H6 formed in the inkjet head.

In this case, while the ejecting nozzles are opposite to the hole injection/transport layer 110*a* located within the lower and upper openings 112*c* and 112*d* and the inkjet head H5 is moved in relation to the substrate 2, the liquid composition is ejected. The amount of the liquid composition ejected from the ejecting nozzles H6 is controlled in such a manner that liquid measure per one drop is controlled. The liquid composition (liquid composition droplets 110e) having the controlled liquid measure is ejected on the hole injection/transport layer 110a from the ejecting nozzles.

In this embodiment, subsequent to the arrangement of the liquid composition droplets 110e, the liquid compositions for other light emitting layers are ejected. In other words, as shown in FIG. 8, without drying the liquid composition droplets 110e dropped on the substrate 2, an arrangement operation for ejection of liquid composition droplets 110f and 110g is performed. In this way, when the liquid composition droplets 110e to 110g for formation of the each color light emitting layer 110b1 to 110b3 are dropped, a plurality of ejecting heads, each of which is filled with the liquid composition for each color, may be independently scanned to arrange the liquid composition droplets 110e to 110g on the substrate 2, or alternatively, may be collectively scanned to arrange the liquid composition droplets 110e to 110f on the substrate 2 almost simultaneously.

As shown in FIG. 8, the ejected liquid compositions 110e to 110g are spread over the hole injection/transport layer 110a and are filled in the lower and upper openings 112c and 112d. On the other hand, even if the liquid composition droplet 110e to 110g are deviated from a predetermined ejection position and are ejected on the lyophobic-processed top surface 112f, the liquid composition droplet 110e to 110g roll into the lower and upper openings 112c and 112d without the top surface 112f wet by the liquid composition droplets 110e to 110g.

The amount of liquid composition ejected on the hole injection/transport layer 110a depends on the size of the lower and upper openings 112c and 112d, the thickness of the light emitting layer 110b to be formed, the concentration of the light emitting layer formation material in the liquid composition, etc. In addition, the liquid compositions 110e to 110g may be ejected on the same hole injection/transport layer 110a not only one time but also multiple times. In this case, the amount of the liquid composition for each time may be equal or different. In addition, the liquid compositions may be ejected on not only the same location of the hole injection/transport layer 110a but also different locations of the hole injection/transport layer 110a for each time.

As a formation material of the light emitting layer, polyfluorene high molecular derivatives, (poly) paraphenylenevinylene derivatives, polyphenylene derivatives, polyvinylcarbazole, polythiophene derivatives, perylene pigment, coumarin pigment, or rhodamine pigment can be used. Moreover, these high molecular materials doped with organic EL materials, such as rubrene, perylene, 9,10-diphenylanthracene, tetraphenylbutadiene, nile red, coumarin 6, or quinacridone can be used. In addition, the solvent for dissolving or dispersing these light emitting layer formation materials uses the same kind for each color light emitting layer.

Here, like the hole injection/transport layer formation process, when the liquid compositions made of different materials, that is, the liquid compositions having different viscosities, are ejected, the film thickness of the light emitting layer may become ununiform due to the viscosity difference. Accordingly, in this embodiment, by making the surface area of the projecting portion 112e of the inorganic bank layer 112a different in advance for each light emitting layers 110b1 to 110b3 (i.e., for different color pixels), the light emitting layer is prevented or suppressed from having ununiform film thickness. More specifically, for a pixel ejecting the liquid composition having relatively high viscosity, the amount of projection of the projecting portion 112e becomes large to increase the surface area of the projecting portion 112e. On the other hand, for a pixel ejecting the liquid composition having relatively low viscosity, the amount of projection of the projecting portion 112e becomes small to decrease the surface area of the projecting portion 112e.

Next, after arranging the liquid compositions 110e to 110g for each color at predetermined positions, the light emitting layers 110b1 to 110b3 are formed by collectively drying the liquid compositions 110e to 110g. In other words, the solvent included in the liquid composition droplets 110e to 110g is evaporated by the drying process to thereby form the red color (R) light emitting layer 110b1, the green color (G) light emitting layer 110b2, and the blue color (B) light emitting layer 110b3, as shown in FIG. 9. In addition, although FIG. 9 shows the red, green and blue color light emitting layers one by one, since the light emitting elements are originally formed in the form of the matrix, as can be seen from FIG. 1 and other figures, a plurality if light emitting layers (corresponding to each color) (not shown) is formed.

In addition, the liquid compositions of the light emitting layers are preferably dried by a vacuum drying process, more specifically, for example, at a room temperature at a pressure of 133.3 Pa (1 Torr) in a nitrogen atmosphere. If the pressure is too low, it is not preferable since the liquid compositions are abruptly boiled. In addition, if temperature is high above the room temperature, it is not preferable since an evaporation speed of the solvent becomes high, and accordingly, the light emitting layer formation material is much adhered to the wall surface of the upper opening 112d.

Next, after the drying process is ended, it is preferable to perform an annealing process for the light emitting layer 110b using a heating means such as a hot plate. The annealing process is performed at a common temperature for a common time wherein light emission characteristics of organic EL layers can be obtained at maximum.

In this way, the hole injection/transport layer 110a and the light emitting layer 110b are formed on the pixel electrode 111.

In addition, prior to the light emitting layer formation material ejecting process, a surface reforming process for reforming the surface of the hole injection/transport layer 110a may be performed.

In the light emitting layer formation process, in order to prevent the hole injection/transport layer 110a from being redissolved, it is preferable to use an insoluble solvent for the hole injection/transport layer 110a as the solvent of the liquid composition used in the light emitting layer formation process. However, since the hole injection/transport layer 110a has low affinity to the solvent, even when the liquid compositions including the solvent are ejected on the hole injection/transport layer 110a, the hole injection/transport layer 110a may not be adhered closely to the light emitting layer 110b or the light emitting layer 110b may not uniformly coated with the liquid compositions. Accordingly, in order to increase the affinity of the surface of the hole injection/transport layer 110a to the solvent and the light emitting layer formation material, it is preferable to perform the surface reforming process before the light emitting layer formation process.

The surface reforming process may be performed by coating a surface reforming material, which is equal or similar to the solvent of the liquid composition used in the light emitting layer formation process, on the hole injection/transport layer 110a using the inkjet method (liquid droplet ejecting method), a spin coat method, or a dip method and drying the coated surface reforming material. Here, the surface reforming material used includes, for example, cyclohexyl benzene, isopropyl biphenyl, trimethylbenzene, etc., which are equal to the solvent of the liquid composition, and includes, for example, tetramethylbenzenetoluene, toluene, xylene, etc., which are similar to the solvent of the liquid composition.

(4) Negative Electrode Formation Process

Figure 10:
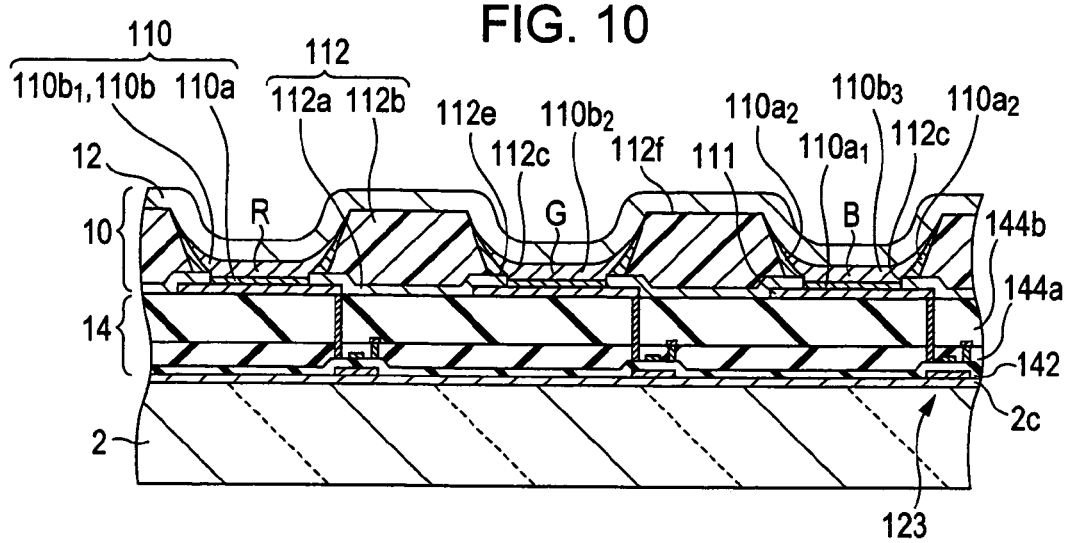
FIG. 10 is a process diagram illustrating the manufacturing method according to the embodiment of the present invention.

Next, as shown in FIG. 10, the negative electrode 12 paired with the pixel electrode (positive electrode) 111 is formed. For example, the negative electrode 12 composed of a calcium layer and an aluminum layer, which are stacked in order, is formed on the entire surface of the substrate 2 including the color light emitting layers 110b and the organic bank layer 112b. Thus, the negative electrode 12 is stacked on the entire region of the color light emitting layers 110b to form the organic EL elements corresponding to the red, green and blue colors.

The negative electrode 12 is preferably formed by, for example, a deposition method, a sputtering method, a CVD method, etc. Particularly, it is preferable to form the negative electrode 12 using the deposition method since this method can prevent damage of the light emitting layers 110b due to heat. In addition, protective layers, such as $SiO_2$ or SiN, for anti-oxidation may be provided on the negative electrode 12.

(5) Sealing Process

Finally, the substrate 2 having the organic EL elements formed thereon and a separately prepared sealing substrate are sealed via a sealing resin. For example, the peripheral of the substrate 2 is coated with the sealing resin such as a thermosetting resin or an ultraviolet curing resin, and then, the sealing substrate is placed on the sealing resin. It is preferable to perform the sealing process in an inert gas atmosphere such as nitrogen gas, argon gas, or helium gas. Air is not preferable since the negative electrode 12 may be oxidized as water or oxygen penetrates into the negative electrode 12 through defects such as pin holes, which may occur in the negative electrode 12.

Thereafter, the organic EL device according to this embodiment is completed by connecting the negative electrode 12 to wiring lines of the substrate 2 and connecting wiring lines of the circuit element portion 14 to a driving IC (driving circuit), which is formed on the substrate 2 or provided in the outside.

According to the above described manufacturing method, even when the viscosities of the liquid compositions used are different for each color light emitting layer (i.e., for each pixel), areas of the projecting portions 112e of the inorganic bank layers 112a are adjusted according to the viscosities of the liquid compositions. As a result, flat light emitting layers 110b1 to 110b3 having a uniform film thickness can be manufactured, thus obtaining an organic EL device having excellent optical properties. In addition, the above-described manufacturing method is very simple since only the amount of projection of the projecting portions 112e of the inorganic bank layers 112a is adjusted.

Although the organic EL device and the manufacturing method thereof have been described in this embodiment, the present invention is applicable to a manufacturing method of a color filter substrate on which coloring layers having a plurality of colors are arranged, or a manufacturing method of a device including a semiconductor device such as an organic TFT. Accordingly, it should be understood that, by such manufacturing methods of the color filter and the device, it is possible to obtain effects of enhancement of flatness of the coloring layers or other functional layers.

Hereinafter, in the above described manufacturing method, a relationship between a film shape (particularly, a surface shape) of each layer formed in the bank layers 112, the viscosity of the liquid composition used for layer formation, and the amount of projection (projecting width) of the projecting portion (the first stack portion) 112e of the inorganic bank layer 112a will be described in detail.

To begin with, FIGS. 17(a) to 17(e) are schematic sectional views illustrating a difference between shapes of a layer 200 obtained when liquid compositions having different viscosities η (mPa·s) are ejected on substrates having bank layers 112 of the same configuration, that is, substrates having the same projecting width L1 (here, L1=3 μm) of the projecting portion 112e of the inorganic bank layer 112a. When the liquid compositions having the different viscosities are ejected to form the layer 200, the surface shape of the formed layer 200 is varied due to a viscosity difference. More specifically, the layer 200 has a U-shaped concave section when the viscosity is low (FIGS. 17(a) and 17(b)), while the layer 200 has a reversed U-shaped convex section when the viscosity is high (FIGS. 17(e) and 17(d)).

On the other hand, FIGS. 18(a) to 18(e) are schematic sectional views illustrating a difference between shapes of a layer 200 obtained when liquid compositions having the same viscosity (here, η=14 mPa·s) are ejected on substrates having bank layers 112 of different shapes, that is, substrates having different projecting widths L1 of the projecting portion 112e of the inorganic bank layer 112a. When the liquid compositions having the same viscosity are ejected on the substrates having the different projecting widths L1 of the projecting portion 112e to form the layer 200, the surface shape of the formed layer 200 is varied due to a projecting width L1 difference. More specifically, the layer 200 has a U-shaped concave section when the projecting width L1 is large (FIG. 18(a)), while the layer 200 has a reversed U-shaped convex section when the projecting width L1 is small (FIG. 18(e)).

It can be seen from FIGS. 17 and 18 that the shape of the layer 200 can be controlled in various ways by the viscosity of the liquid compositions and the amount of projection of the projecting portion 112e (i.e., the area of the projecting portion 112e). In examples shown in FIGS. 17 and 18, when the liquid composition having the viscosity η of 14 mPa·s is used and the projecting width L1 of the projecting portion 112e is 3 μm, the layer 200 having the flat surface shape can be formed. For example, as shown in FIG. 19, when the liquid composition having relatively low viscosity (η=4 mPa·s) is used, the layer 200 having the flat surface shape can be formed by making the projecting width L1 relatively small (L1=1 μm). On the other hand, for example, as shown in FIG. 20, when the liquid composition having relatively high viscosity (η=24 mPa·s) is used, the layer 200 having the flat surface shape can be formed by making the projecting width L1 relatively large (L1=5 μm).

Figure 21A:
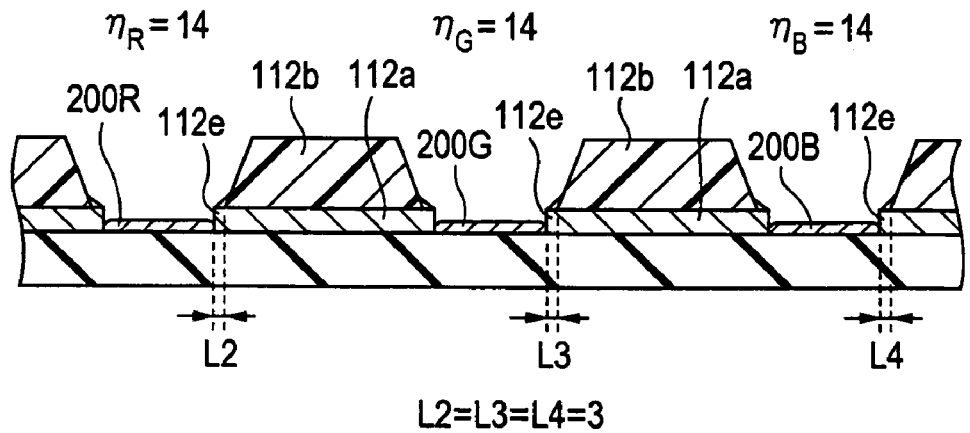
FIGS. 21A-21C are sectional views illustrating a relationship between a shape of a layer to be formed, viscosity of a liquid composition, and a projecting width of a bank.

On the other hand, when the bank composed of two layers as in this embodiment is formed on the substrate, a lower layer of the bank has a projecting shape, and a single functional layer is formed in the bank using the liquid droplet ejecting method, flatness of the surface shape of the functional layer can be achieved as follows. As shown in FIG. 21, if a color filter is formed as the functional layer, when the viscosity of the liquid composition ejected using the liquid droplet ejecting method is common for the colors R, G and B in a process for forming a red color layer 200R, a green color layer 200G and a blue color layer 200B, a flat color filter can be obtained by making bank shapes for the colors R, G and B equal. In other words, when the projecting widths of the projecting portions 112e of the lower layer (inorganic bank layer) 112a of the banks for forming the color layers 200R, 200G and 200B are set to 3 μm, that is, L2=L3=L4=3 μm, and the viscosities of the liquid compositions for forming the color layers 200R, 200G and 200B are set to 14 mPa·s, that is, ηR=ηG=ηB=14 mPa·s, the surface shape of each color layer 200R, 200G and 200B can become flat.

In addition, in respect that the color layers 200R, 200G and 200B are formed of different materials, it is possible to unify the viscosities of the liquid compositions for the colors by using different kinds of solvents for each color, using solvents having different concentrations, or, if necessary, making the molecular weights of the materials of the color layers different for each color.

Figure 21B:
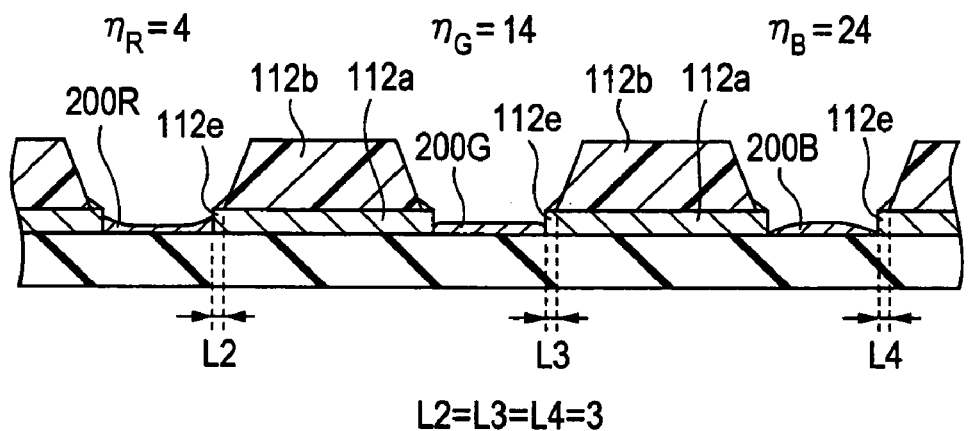

On the other hand, as shown in FIG. 21(b), when the viscosities of the liquid compositions for the color layers are different, for example, ηR=4 mPa·s, ηG=14 mPa·s, and ηB=24 mPa·s, and the projecting widths of the projecting portions 112e of the lower layer (inorganic bank layer) 112a in the bank are set to 3 μm, that is, L2=L3=L4=3 μm, the red color layer 200R made of the liquid composition having low viscosity has a concave surface shape, while the blue color layer 200B made of the liquid composition having high viscosity has a convex surface shape.

Figure 21C:
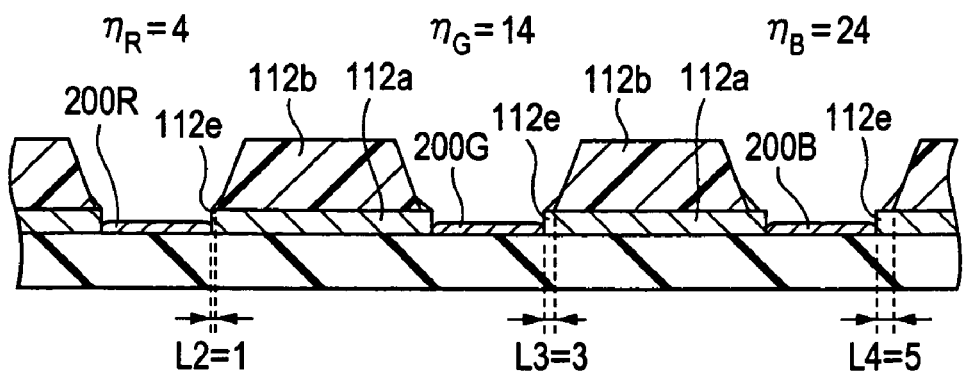

Accordingly, when the viscosities of the liquid compositions for the color layers are different, the color layers 200R, 200G and 200B having the flat surface shape can be formed by setting the projecting widths of the projecting portions 112e of the lower layer (inorganic bank layer) 112a in the bank different for each color layer, as shown in FIG. 21(c). More specifically, an optimization can be achieved by setting the projecting width L2 of the bank to 1 μm in the red color layer 200R using the liquid composition having ηR=4 mPa·s, setting the projecting width L3 of the bank to 3 μm in the green color layer 200G using the liquid composition having ηG=14 mPa·s, and setting the projecting width L4 of the bank to 5 μm in the blue color layer 200B using the liquid composition having ηR=24 mPa·s. In addition, since the viscosity of the liquid composition depends on ejectability, solubility, components, etc. of the liquid composition, it is common that the viscosity of the liquid composition is different for different kinds of functional layers to be formed. In this case, as described above, by setting the projecting width of the lower layer (inorganic bank layer) of the bank composed of two layers to be different for each kind of functional layer, the functional layer having a flat surface shape and a uniform film thickness can be formed.

On the other hand, in the organic EL device according to this embodiment, since the formation materials of the color light emitting layers 110b1, 110b2 and 110b3 are different, the liquid compositions for forming the light emitting layers have different viscosities for each color layer under normal conditions (same solvent, same concentration). Meanwhile, since componential materials of the color layers are equal, the liquid compositions for forming the hole injection/transport layer 110a formed under the corresponding light emitting layer 110 has the same viscosity for each color layer under normal conditions (same solvent, same concentration).

Accordingly, as shown in FIG. 22(a), in order to obtain flat hole injection/transport layers 110aR, 110aG and 110aB, when the viscosities of the liquid compositions of the layers 110aR, 110aG and 110aB are equal, for example, ηaR=ηaG=ηaB=14 mPa·s, and the projecting widths of the inorganic bank layers 112a are set to 3 μm, that is, L2=L3=L4=3 μm, the light emitting layers 110b1, 110b2 and 110b3 having the flat surface shape can be formed by setting the viscosities of the liquid compositions equal for each color, as shown in FIG. 22(b). Here, in order to set the viscosities of the liquid compositions for forming the color light emitting layers 110b1, 110b2 and 110b3 to be equal, that is, ηbR=ηbG=ηbB=14 mPa·s, different kinds of solvents are used for each color liquid composition.

As described above, when the projecting widths L2, L3 and L4 of the inorganic bank layers 112a are set to be equal for each color, both the hole injection/transport layer 110a and the light emitting layer 110b can obtain a flat film shape by setting the viscosities of the liquid compositions to be equal.

On the other hand, when the light emitting layers 110b1, 110b2 and 110b3 are formed, if the liquid composition for each color includes the solvent of the same kind and the same concentration, the liquid compositions for formation of the light emitting layers have different viscosities for each color. More specifically, as shown in FIG. 23, the liquid composition for the red color light emitting layer 110bR has the viscosity of ηbR=4 mPa·s, the liquid composition for the green color light emitting layer 110bG has the viscosity of ηbG=14 mPa·s, and the liquid composition for the blue color light emitting layer 110bB has the viscosity of ηbB=24 mPa·s. In this case, as shown in FIG. 23, when the projecting widths of the inorganic bank layers 112a are set to 3 μm, that is, L2=L3=L4=3 μm, the red color layer 110b1 having low viscosity (ηbR=4 mPa·s) has a concave surface shape, while the blue color layer 110b3 having high viscosity (ηbB=24 mPa·s) has a convex surface shape.

Figure 24A:
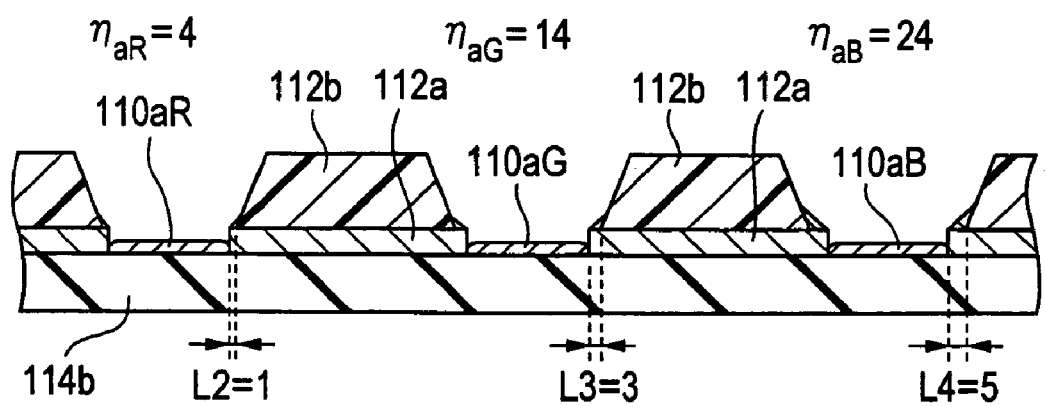
FIGS. 24A and 24B are sectional views illustrating a relationship between a shape of a layer to be formed, viscosity of a liquid composition, and a projecting width of a bank.
Figure 24B:
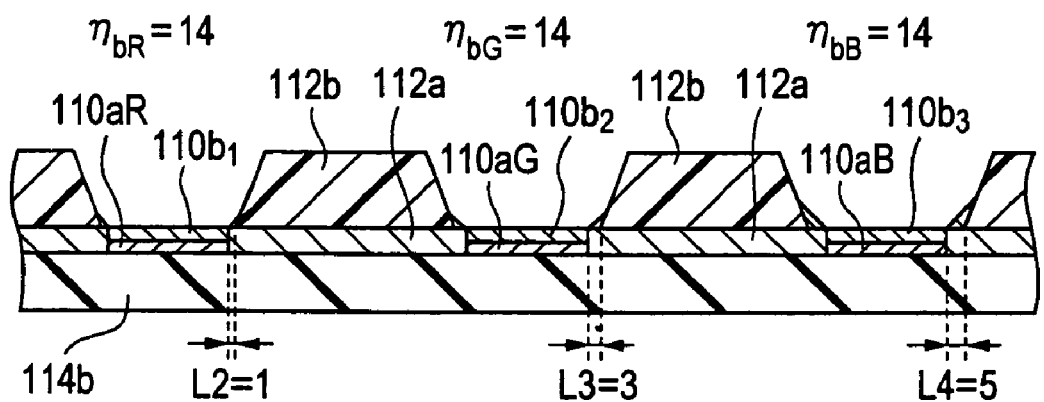

Accordingly, when the viscosities of the liquid compositions for formation of the light emitting layers are different for each color, the light emitting layers having the flat surface shape can be formed by setting the projecting widths of the inorganic bank layers 112a to be different for each color, as shown in FIG. 24. More specifically, the projecting width L2 of the bank forming the red color light emitting layer is set to 1 μm, the projecting width L3 of the bank forming the green color light emitting layer is set to 3 μm, and the projecting width L4 of the bank forming the blue color light emitting layer is set to 5 μm.

In addition, when the projecting widths of the banks are set to be different for each color, in order to form the hole injection/transport layer 110a in a flat shape, which is a lower layer of the light emitting layer 110b, there is a need to set the viscosities of the liquid compositions of the layer 110a to be different for each color. Here, as shown in FIG. 24(a), the liquid composition for the red color hole injection/transport layer 110aR has the viscosity of ηaR=4 mPa·s, the liquid composition for the green color hole injection/transport layer 110aG has the viscosity of ηaG=14 mPa·s, and the liquid composition for the blue color hole injection/transport layer 110aB has the viscosity of ηaB=24 mPa·s. Accordingly, the hole injection/transport layer 110a having the flat surface shape can be obtained. In addition, the light emitting layers 110b1, 110b2 and 110b3 can be formed by ejecting the liquid compositions having the above-mentioned viscosities on the hole injection/transport layer 110a. Accordingly, the light emitting layer 110b having the flat surface shape can be obtained.

(Electronic Apparatus)

Figure 16:
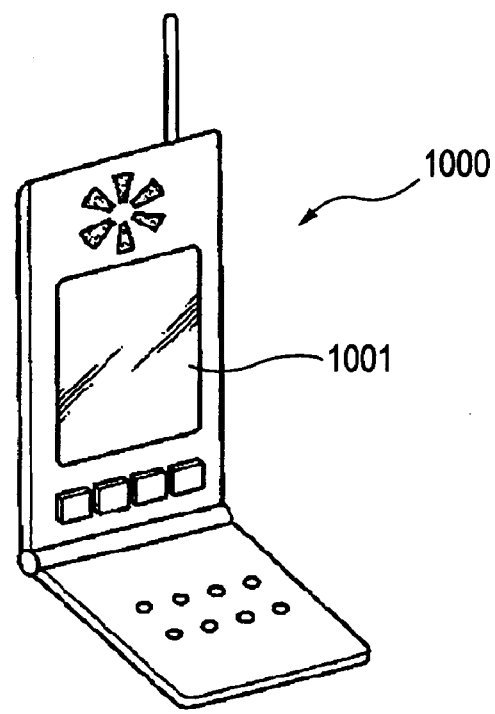
FIG. 16 is a perspective view illustrating an example of an electronic apparatus.
Figure 17A:
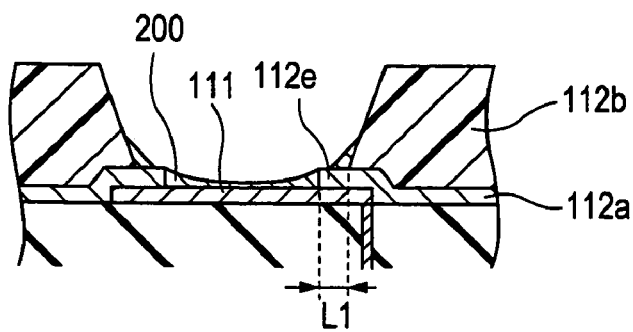
FIGS. 17A-17E are sectional views illustrating a relationship between a shape of a layer to be formed, viscosity of a liquid composition, and a projecting width of a bank.
Figure 17B:
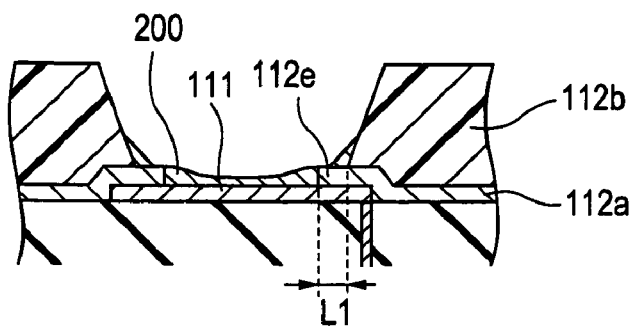
Figure 17C:
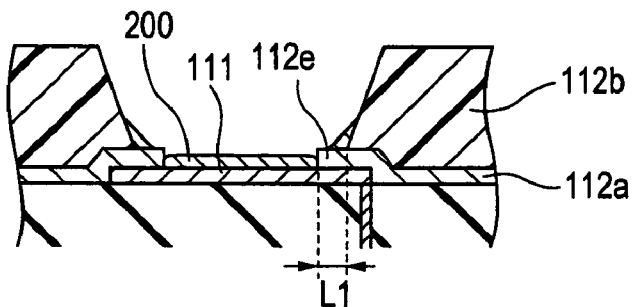
Figure 17D:
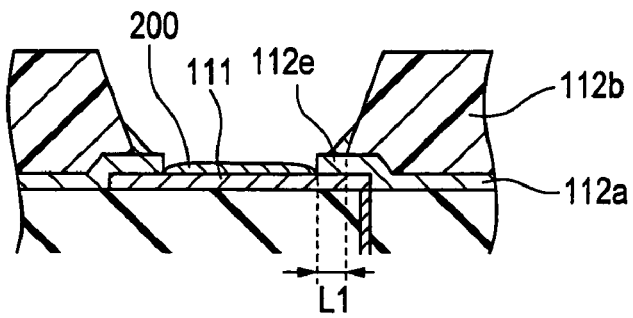
Figure 17E:
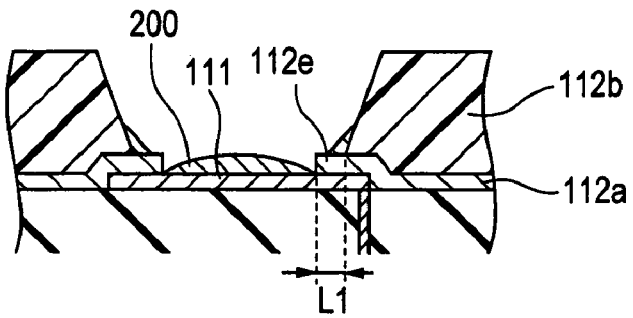
Figure 18A:
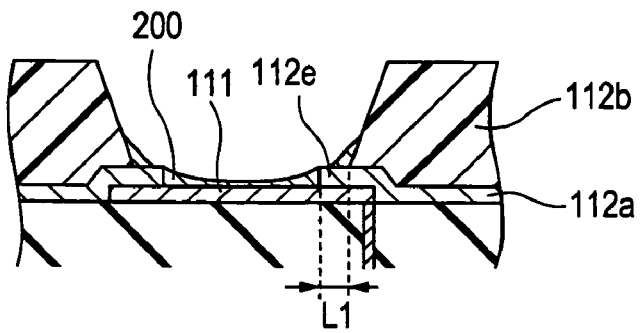
FIGS. 18A-18E are sectional views illustrating a relationship between a shape of a layer to be formed, viscosity of a liquid composition, and a projecting width of a bank.
Figure 18B:
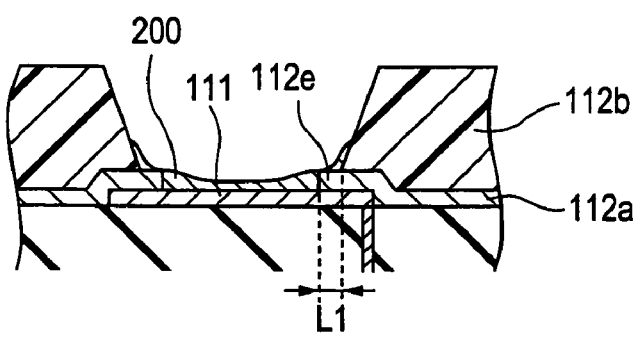
Figure 18C:
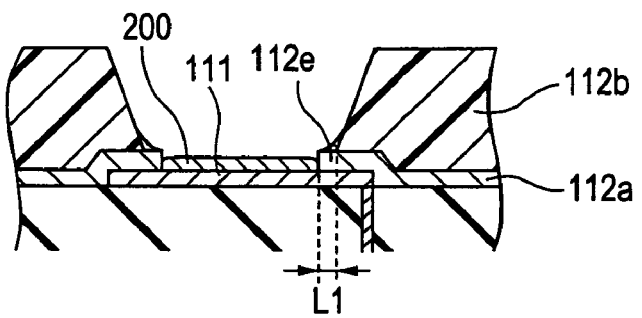
Figure 18D:
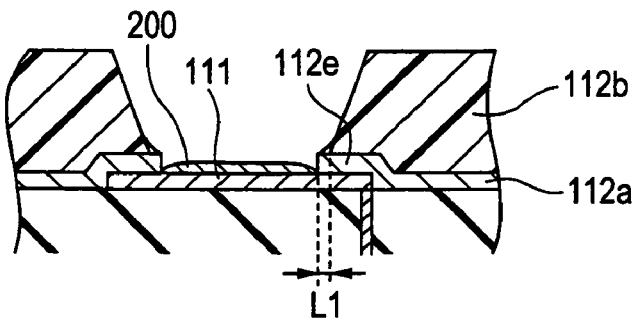
Figure 18E:
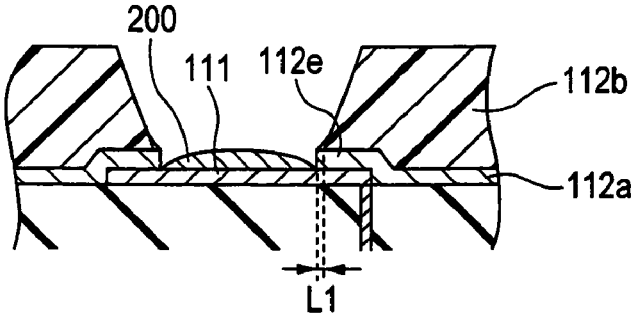
Figure 19A:
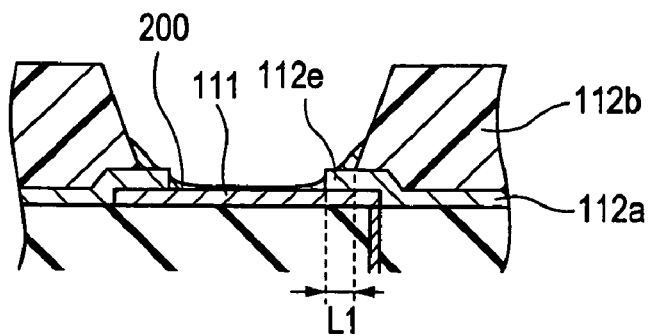
FIGS. 19A-19E are sectional views illustrating a relationship between a shape of a layer to be formed, viscosity of a liquid composition, and a projecting width of a bank.
Figure 19B:
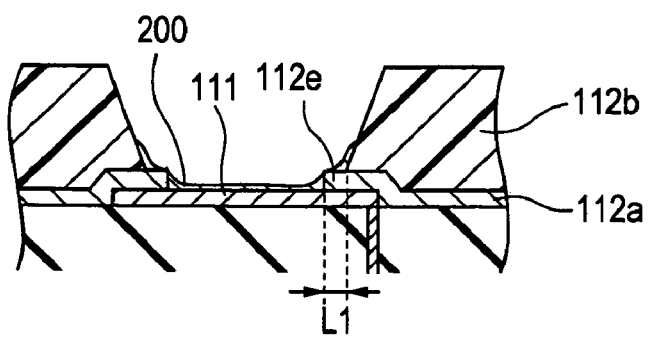
Figure 19C:
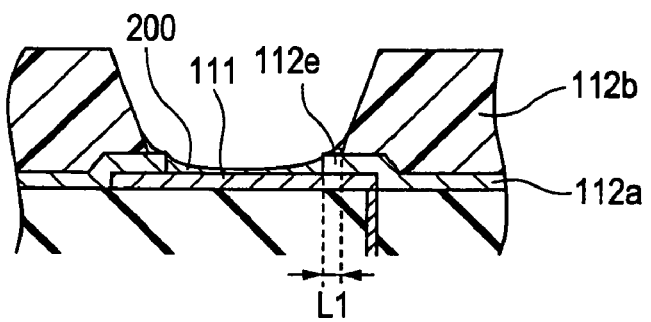
Figure 19D:
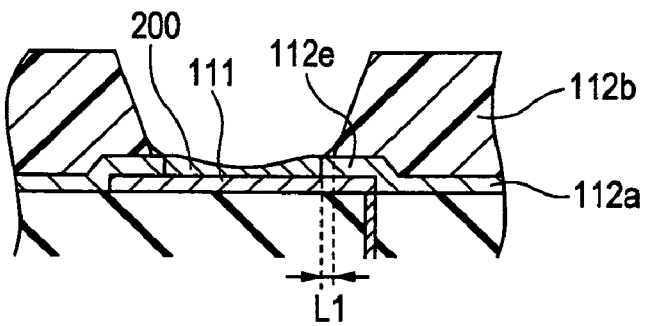
Figure 19E:
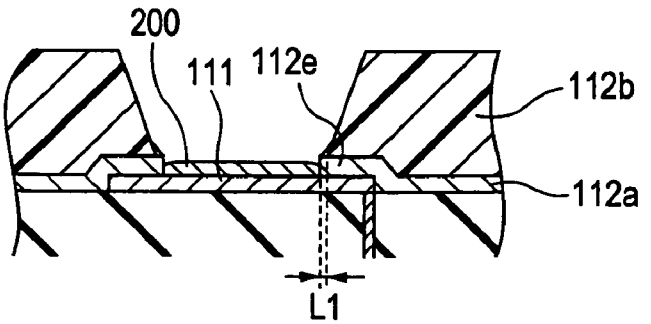
Figure 20A:
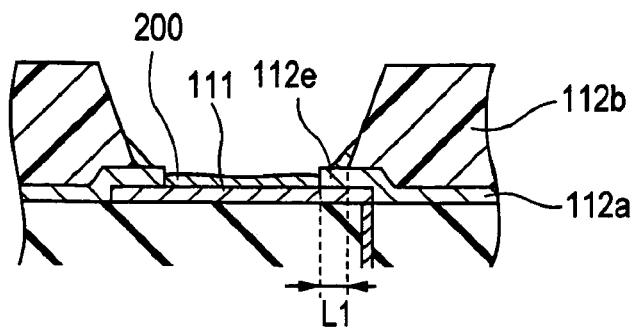
FIGS. 20A-20E are sectional views illustrating a relationship between a shape of a layer to be formed, viscosity of a liquid composition, and a projecting width of a bank.
Figure 20B:
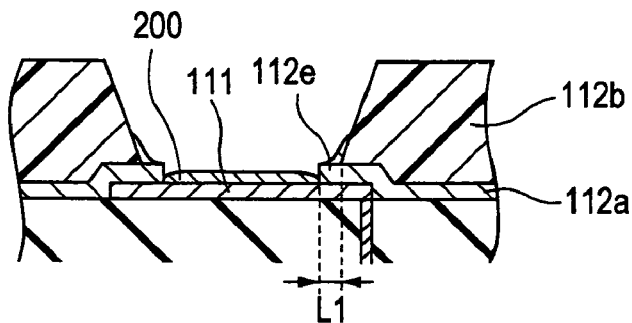
Figure 20C:
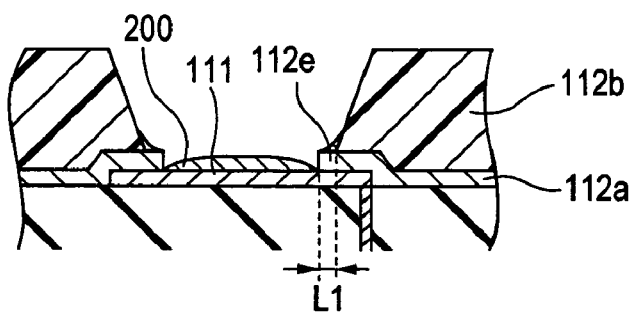
Figure 20D:
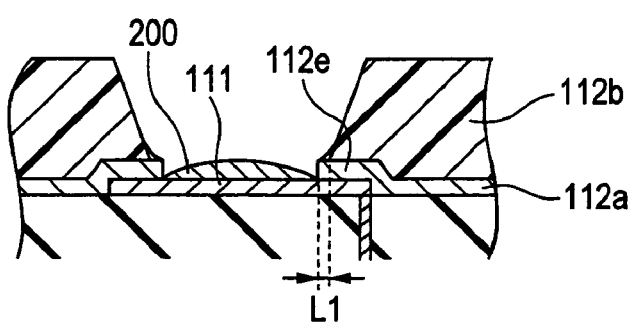
Figure 20E:
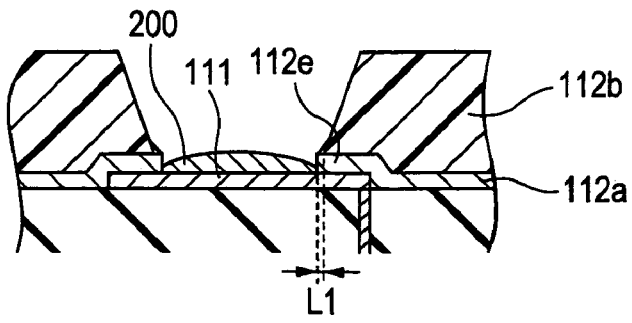

FIG. 16 shows an embodiment of an electronic apparatus related to the present invention. The electronic apparatus according to this embodiment includes the above-described organic EL device as a display means. In the figure, an example of a portable telephone is shown through a perspective view, where reference numeral 1000 denotes a portable telephone body and reference numeral 1001 denotes a display unit employing the organic EL device 1. The electronic apparatus including the organic EL device related to this embodiment as the display means can exhibit good light emission characteristics.

What is claimed is:

1. A method of manufacturing a color filter substrate including a plurality of coloring layers having a plurality of colors in a predetermined pattern, the method comprising:

a partition wall portion formation step of forming, on a substrate, a first partition wall portion having a first opening defining a region in which the coloring layers are formed and a second partition wall portion located on the first partition wall portion and having a second opening defining the region in which the coloring layers are formed; and an ejection step of ejecting liquid substances for the openings of the partition wall portions by using a liquid droplet ejecting method, the liquid substances being made by dissolving or dispersing coloring materials composing the respective coloring layers in solvents, wherein the ejected liquid substances have different viscosities for each coloring layer, and wherein, in the partition wall portion formation step, the first partition wall portion projects from an inner surface of the second opening of the second partition wall portion, a surface area of a portion of the first partition wall portion projecting from the second partition wall portion becomes relatively small in an opening through which the liquid substance having relatively low viscosity is ejected, and the surface area of the portion of the first partition wall portion projecting from the second partition wall portion becomes relatively large in an opening through which the liquid substance having relatively high viscosity is ejected.

2. A method of manufacturing an electro-optical device including different types of electro-optical layers in a predetermined pattern, the method comprising:

a partition wall portion formation step of forming on a substrate a first partition wall portion having a first opening defining a region in which the electro-optical layers are formed and a second partition wall portion located on the first partition wall portion and having a second opening defining the region in which the electro-optical layers are formed; and an ejection step of ejecting liquid substances for the openings of the partition wall portions by using a liquid droplet ejecting method, the liquid substances being made by dissolving or dispersing functional materials composing the respective electro-optical layers in solvents, wherein the ejected liquid substances have different viscosities for each electro-optical layer, and wherein, in the partition wall portion formation step, the first partition wall portion projects from an inner surface of the second opening of the second partition wall portion, a surface area of a portion of the first partition wall portion projecting from the second partition wall portion becomes relatively small in an opening through which the liquid substance having relatively low viscosity is ejected, and the surface area of the portion of the first partition wall portion projecting from the second partition wall portion becomes relatively large in an opening through which the liquid substance having relatively high viscosity is ejected.

3. The method of manufacturing an electro-optical device according to claim 2, wherein, in the partition wall portion formation step, the projecting length of the first partition wall portion projecting from the inner surface of the second opening of the second partition wall portion becomes relatively small in an opening through which the liquid substance having relatively low viscosity is ejected, and the projecting length of the first partition wall portion projecting from the second partition wall portion becomes relatively large in an opening through which the liquid substance having relatively high viscosity is ejected.

4. The method of manufacturing an electro-optical device according to claim 2, wherein, the solvent included in the liquid substance is of the same kind for the same type of electro-optical layers.

5. The method of manufacturing an electro-optical device according to claim 2, further comprising:

after the ejection step, a drying step of drying the ejected liquid substances simultaneously for the same type of electro-optical layers.

* * * * *